(12) United States Patent
Fukuchi

(10) Patent No.: US 12,446,439 B2
(45) Date of Patent: Oct. 14, 2025

(54) LIGHT EMITTING DEVICE, MANUFACTURING METHOD OF LIGHT EMITTING DEVICE, DISPLAY DEVICE, PHOTOELECTRIC CONVERSION DEVICE, ELECTRONIC APPARATUS, ILLUMINATION DEVICE, MOVING BODY, AND WEARABLE DEVICE

(71) Applicant: CANON KABUSHIKI KAISHA, Tokyo (JP)

(72) Inventor: Yusuke Fukuchi, Oita (JP)

(73) Assignee: Canon Kabushiki Kaisha, Tokyo (JP)

( * ) Notice: Subject to any disclaimer, the term of this patent is extended or adjusted under 35 U.S.C. 154(b) by 390 days.

(21) Appl. No.: 18/303,741

(22) Filed: Apr. 20, 2023

(65) Prior Publication Data
US 2023/0363240 A1 Nov. 9, 2023

(30) Foreign Application Priority Data
May 6, 2022 (JP) .................. 2022-076750

(51) Int. Cl.
*H10K 59/80* (2023.01)
*H10K 59/12* (2023.01)
*H10K 59/122* (2023.01)

(52) U.S. Cl.
CPC ... *H10K 59/80521* (2023.02); *H10K 59/1201* (2023.02); *H10K 59/122* (2023.02); *H10K 59/80523* (2023.02)

(58) Field of Classification Search
CPC ......... H10K 59/80521; H10K 59/1201; H10K 59/122; H10K 59/80523; H10K 59/80515;
(Continued)

(56) References Cited

U.S. PATENT DOCUMENTS 8,729,539 B2 5/2014 Kakinuma
9,716,208 B2 7/2017 Dozen
(Continued)

FOREIGN PATENT DOCUMENTS

JP 2013-187095 A 9/2013
JP 2014-123527 A 7/2014
(Continued)

OTHER PUBLICATIONS

Mar. 18, 2024 Japanese Official Action in Japanese Patent Appln. No. 2022-076750.
(Continued)

*Primary Examiner* — Elias Ullah
(74) *Attorney, Agent, or Firm* — Venable LLP

(57) ABSTRACT

A light emitting device in which pixels are arranged is provided. Each of the pixels includes an organic layer including a light emitting layer, a reflective layer arranged between the main surface and the organic layer, a first insulator arranged between the reflective layer and the organic layer, a transmission electrode arranged between the first insulator and the organic layer, and a second insulator arranged so as to cover a peripheral edge portion of the transmission electrode while including an opening portion that exposes a part of the transmission electrode. A groove extending through the first insulator is provided between the peripheral edge portion of the transmission electrode and the reflective layer, the transmission electrode is electrically connected to the reflective layer in the groove, and the second insulator includes a recess portion in a portion covering the groove.

18 Claims, 15 Drawing Sheets

(58) Field of Classification Search
CPC ...... H10K 50/19; H10K 59/876; H10K 59/35; H10K 59/38
See application file for complete search history.

(56) References Cited

U.S. PATENT DOCUMENTS

| | | |
|---|---|---|
| 10,985,323 B2 | 4/2021 | Kajimoto |
| 11,672,171 B2 | 6/2023 | Kajimoto |
| 2013/0234120 A1 | 9/2013 | Kakinuma |
| 2014/0175469 A1 | 6/2014 | Dozen |
| 2019/0123279 A1 | 4/2019 | Kajimoto |
| 2021/0202848 A1 | 7/2021 | Kajimoto |
| 2022/0013604 A1 | 1/2022 | Takahashi |
| 2022/0255042 A1 | 8/2022 | Naruse |
| 2023/0122008 A1 | 4/2023 | Fukuchi |

FOREIGN PATENT DOCUMENTS

| | | |
|---|---|---|
| JP | 2015-144106 A | 8/2015 |
| JP | 2021-072282 A | 5/2021 |
| JP | 2021-073731 A | 5/2021 |
| JP | 2022-022875 A | 2/2022 |
| KR | 10-2021-0001258 A | 1/2021 |

OTHER PUBLICATIONS

Nov. 25, 2024 Japanese Official Action in Japanese Patent Appln. No. 2022-076750.

Jul. 26, 2024 Japanese Official Action in Japanese Patent Appln. No. 2022-076750.

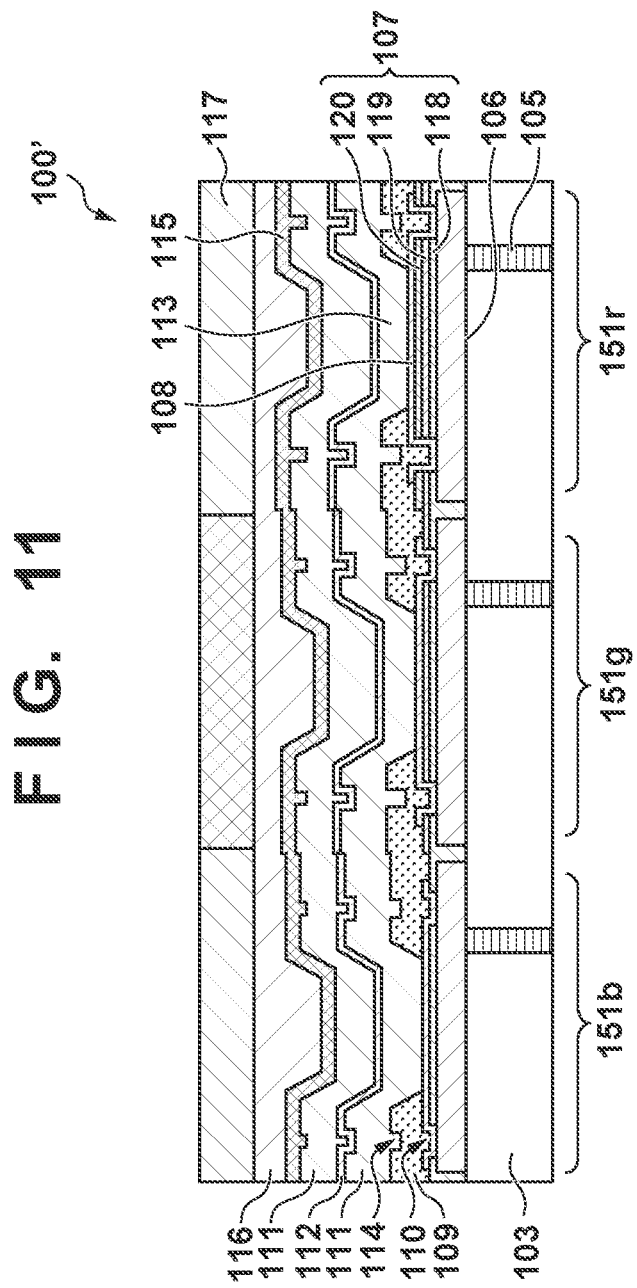

LIGHT EMITTING DEVICE, MANUFACTURING METHOD OF LIGHT EMITTING DEVICE, DISPLAY DEVICE, PHOTOELECTRIC CONVERSION DEVICE, ELECTRONIC APPARATUS, ILLUMINATION DEVICE, MOVING BODY, AND WEARABLE DEVICE

BACKGROUND OF THE INVENTION

Field of the Invention

The present invention relates to a light emitting device, a manufacturing method of the light emitting device, a display device, a photoelectric conversion device, an electronic apparatus, an illumination device, a moving body, and a wearable device.

Description of the Related Art

Interest in a light emitting device using a light emitting element such as an organic electroluminescence (EL) element has increased. Japanese Patent Laid-Open No. 2014-123527 describes a light emitting device including a recess provided in a partition wall located between lower electrodes to suppress a crosstalk phenomenon in which a current leaks between adjacent pixels and causes light emission.

SUMMARY OF THE INVENTION

In Japanese Patent Laid-Open No. 2014-123527, after forming an insulating layer on a wiring pattern, a connection hole for connecting the lower electrode and the wiring pattern and a groove for generating a recess during later formation of the partition wall are formed in the insulating layer. Then, an electrode layer is formed, and the lower electrodes are formed using a photography process or the like. In the photolithography process of forming the lower electrodes, the film thickness of the insulating layer changes in the vicinity of the groove, and this can cause an exposure focus shift, an alignment shift, and the like. In order to suppress the exposure focus shift and the like, it is necessary to arrange the lower electrode away from the groove by a predetermined distance, and this can hinder miniaturization of pixels for high-resolution display.

Some embodiments of the present invention provide a technique advantageous in miniaturization of pixels.

According to some embodiments, a light emitting device in which a plurality of pixels are arranged on a main surface of a substrate, wherein each of the plurality of pixels comprises an organic layer including a light emitting layer, a reflective layer arranged between the main surface and the organic layer, a first insulating layer arranged between the reflective layer and the organic layer, a transmission electrode arranged between the first insulating layer and the organic layer, and a second insulating layer arranged so as to cover a peripheral edge portion of the transmission electrode while including an opening portion that exposes a part of the transmission electrode, a groove extending through the first insulating layer is provided between the peripheral edge portion of the transmission electrode and the reflective layer, the transmission electrode is electrically connected to the reflective layer in the groove, and the second insulating layer includes a recess portion in a portion covering the groove, is provided.

According to some other embodiments, a manufacturing method of a light emitting device in which a plurality of pixels are arranged on a main surface of a substrate, the method comprising: forming reflective layers so as to respectively correspond to the plurality of pixels; forming a first insulating layer so as to cover the reflective layers; forming, in the first insulating layer, grooves each of which extends through the first insulating layer and exposes the reflective layer; forming, after the grooves are formed, transmission electrodes respectively corresponding to the plurality of pixels; and forming a second insulating layer arranged so as to cover peripheral edge portions of the transmission electrodes while including opening portions each of which exposes a part of the transmission electrode, wherein the groove is arranged between the peripheral edge portion of the transmission electrode and the reflective layer, the transmission electrode is electrically connected to the reflective layer in the groove, and the second insulating layer includes a recess portion in a portion covering the groove, is provided.

Further features of the present invention will become apparent from the following description of exemplary embodiments (with reference to the attached drawings).

BRIEF DESCRIPTION OF THE DRAWINGS

FIG. 11 is a sectional view showing the modification of the light emitting device shown in FIGS. 1A and 1B;

DESCRIPTION OF THE EMBODIMENTS

Figure 1A:
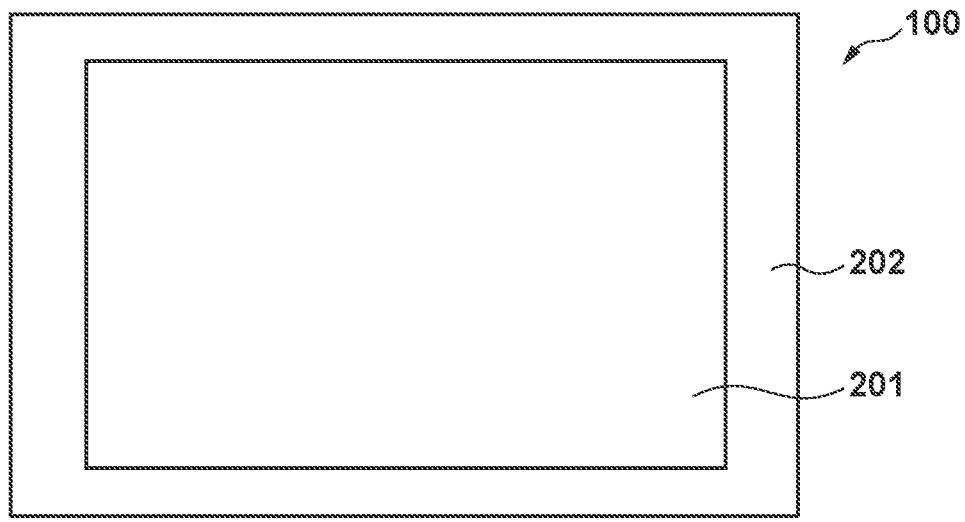
FIG. 1A is a plan view showing an arrangement example of a light emitting device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

With reference to FIGS. 1A to 11, a light emitting device according to an embodiment of the present disclosure will be described. FIG. 1A is a plan view showing an arrangement example of a light emitting device 100 in the embodiment. The light emitting device 100 can include, for example, a display region 201 in which a plurality of pixels are arranged in a two-dimensional array on the main surface of a substrate, and a peripheral circuit region 202 that controls a writing operation of the pixel signals of an image to be displayed in the display region 201. The light emitting device 100 can display an image (video) such as a still image or a moving image in the display region 201. The image may be a monochrome image or a full-color image.

Figure 1B:
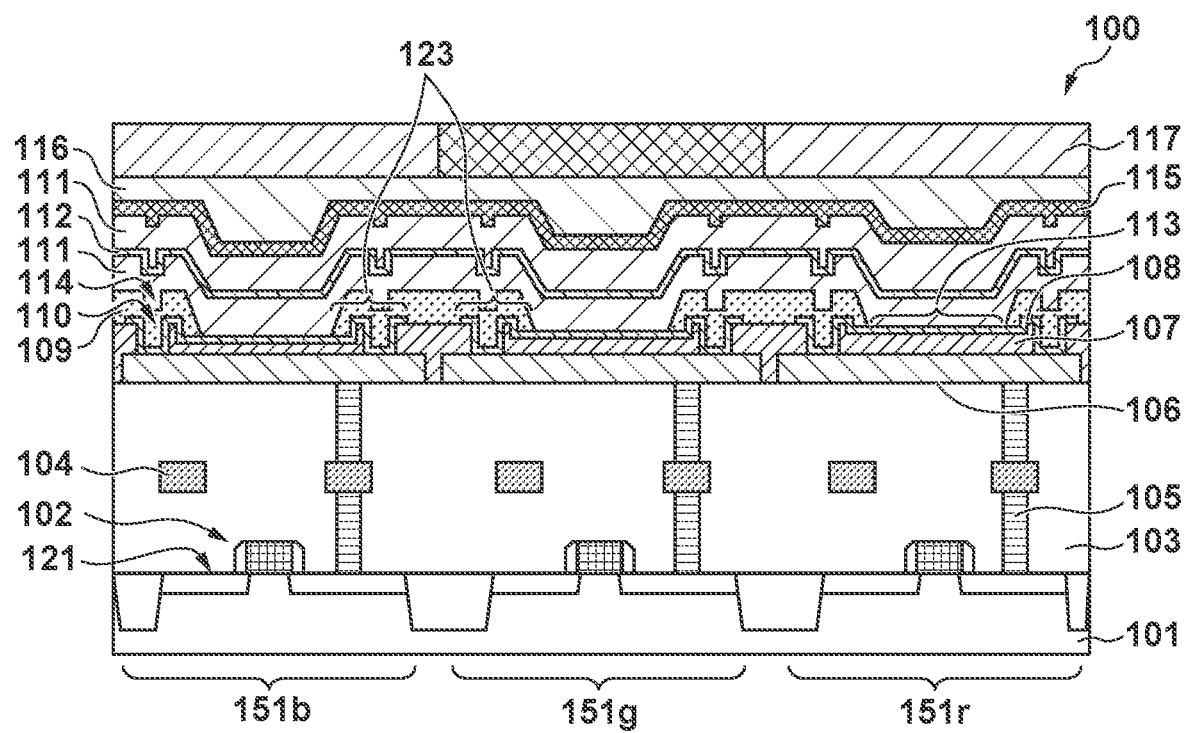
FIG. 1B is a sectional view showing the arrangement example of the light emitting device according to the embodiment.

FIG. 1B is a sectional view of a pixel 151 that is arranged in the display region 201 and includes a light emitting element configured to contain a light emitting material such as an organic electroluminescence (EL) material in an organic layer 111. In this embodiment, a plurality of pixels 151 including a pixel 151b, a pixel 151g, and a pixel 151r for displaying different colors are formed on a main surface 121 of a substrate 101 in the display region 201. Hereinafter, to indicate a specific pixel, a suffix is added at the end of a reference numeral, like the pixel 151"b", and to indicate an arbitrary pixel, it will simply be expressed as the pixel "151". This also applies to other constituent elements.

Each of the plurality of pixels 151 includes a reflective layer 106, an optical distance adjustment layer 107, a transmission electrode 108, an insulating layer 109, the organic layer 111 including a light emitting layer, and an upper electrode 115. The reflective layer 106 is arranged between the main surface 121 of the substrate 101 and the organic layer 111. The optical distance adjustment layer 107 is arranged between the reflective layer 106 and the organic layer 111. The transmission electrode 108 is arranged between the optical distance adjustment layer 107 and the organic layer 111. The insulating layer 109 is arranged so as to cover a peripheral edge portion 123 of the transmission electrode 108 while including an opening portion 113 that exposes a part of the transmission electrode 108. The upper electrode 115 is arranged so as to cover the organic layer 111 including the light emitting layer.

The substrate 101 can be a base using a semiconductor material, for example, silicon. An element 102 such as a transistor configured to control light emission (for example, a light amount and a light emission time) in each pixel 151 is arranged on the main surface 121 of the substrate 101. An interlayer insulating layer 103 is arranged on the element 102 so as to cover the main surface 121 of the substrate 101 and the element 102. For the interlayer insulating layer 103, silicon oxide, silicon nitride, silicon oxynitride, silicon carbide, or the like can be used. The interlayer insulating layer 103 can have a stacked structure using these materials. A wiring layer 104 in which a wiring pattern and the like are formed is arranged in the interlayer insulating layer 103. In the example shown in FIG. 1B, one wiring layer 104 is arranged. However, the present invention is not limited to this, and two or more wiring layers 104 may be arranged in the interlayer insulating layer 103.

The reflective layer 106 that reflects light generated by the light emitting layer is arranged above the interlayer insulating layer 103 between the organic layer 111 including the light emitting layer and the main surface 121 of the substrate 101. As the material of the reflective layer 106, for example, a metal material such as an aluminum alloy can be selected. A conductive plug 105 is arranged between the element 102, for example, the source region, drain region, or gate electrode of the transistor and the wiring layer 104 and between the wiring layer 104 and the reflective layer 106. The conductive plug 105 electrically connects the element 102 to the wiring layer 104 and the wiring layer 104 to the reflective layer 106. For the conductive plug 105, for example, tungsten (W) including a barrier metal layer such as titanium/titanium nitride (Ti/TiN) is used.

At least a part of the optical distance adjustment layer 107 is arranged between the reflective layer 106 and the transmission electrode 108. As shown in FIG. 1B, the optical distance adjustment layer 107 can also function as an insulating layer that electrically insulates the reflective layer 106 of the pixel and the reflective layer 106 of the adjacent pixel of the plurality of pixels 151. The insulating layer 109 covers the peripheral edge portion of the transmission electrode 108, and is arranged between the optical distance adjustment layer 107 and the organic layer 111 including the light emitting layer between pixels adjacent to each other among the plurality of pixels 151. That is, the optical distance adjustment layer 107 and the insulating layer 109 are arranged between the pixels adjacent to each other among the plurality of pixels 151, thereby electrically separating, for each pixel, the transmission electrodes 108 serving as the individual electrodes of the respective pixels 151. For the optical distance adjustment layer 107 and the insulating layer 109, for example, a dielectric material such as silicon oxide or silicon nitride can be used. Therefore, the optical distance adjustment layer 107 is sometimes referred to as an insulating layer.

At least a part of the transmission electrode 108 is arranged between the reflective layer 106 and the organic layer 111 including the light emitting layer, and transmits the light generated by the light emitting layer. For the transmission electrode 108, for example, a transmissive conductive material such as indium tin oxide (ITO) or indium zinc oxide (IZO) is used.

The optical distance adjustment layer 107 is provided with a groove 110 extending through the optical distance adjustment layer 107 between the peripheral edge portion 123 of the transmission electrode 108 and the reflective layer 106. The transmission electrode 108 is electrically connected to the reflective layer 106 in the groove 110. The groove 110 includes a portion extending along the outer edge of the opening portion 113 of the insulating layer 109, and details thereof will be described later.

The insulating layer 109 is arranged between the transmission electrode 108 and the organic layer 111 including the light emitting layer. A part of the insulating layer 109 is etched to bring the transmission electrode 108 into contact with the organic layer 111 including the light emitting layer to form an opening portion 113. The insulating layer 109 includes a recess portion 114 in the portion covering the groove 110.

In this embodiment, the organic layer 111 includes at least two light emitting layers, and at least one carrier injection layer 112 arranged between the at least two light emitting layers, and the pixel 151 includes a so-called tandem type light emitting element. However, the present invention is not limited to this, and the organic layer 111 is only required to include at least one light emitting layer. The organic layer 111 may include three or more light emitting layers. The highly conductive carrier injection layer 112 for injecting carries such as holes and electrons into the respective light emitting layers is arranged between the light emitting layers.

The upper electrode 115 is arranged above the organic layer 111. For the upper electrode 115, a light-transmissive conductive material can be used, like the transmission electrode 108. The transmission electrode 108 and the upper electrode 115 function as an anode and a cathode for the organic layer 111 to form a light emitting element. As shown in FIG. 1B, the organic layer 111 and the upper electrode 115 may be shared by the plurality of pixels 151. For example, the organic layer 111 and the upper electrode 115 may integrally be formed all over the display region 201.

A sealing layer 116 is arranged on the upper electrode 115 so as to cover the upper electrode 115. The sealing layer 116 suppresses invasion of water from the atmosphere into the organic layer 111. Silicon nitride or the like may be used for the sealing layer 116. The sealing layer 116 may have a single layer structure or a stacked structure.

Color filters 117 are arranged on the sealing layer 116. In this embodiment, the light emitting layer included in the organic layer 111 emits white light, and the color filters 117 convert the light into colors different from each other in the pixels 151*b*, 151*g*, and 151*r*. In this embodiment, a color filter 117*b* that transmits blue light is formed in the pixel 151*b*, a color filter 117*g* that transmits green light is formed in the pixel 151*g*, and a color filter 117*r* that transmits red light is formed in the pixel 151*r*.

Next, with reference to FIGS. 2A to 3C, a manufacturing method of the groove 110 extending through a part of the optical distance adjustment layer 107 and the recess portion 114 in a portion of the insulating layer 109 covering the groove 110 will be described in detail. In FIGS. 2A to 3C, the constituent elements closer to the main surface 121 of the substrate 101 than the reflective layer 106 may be the same as in FIG. 1B. Hence, some of the constituent elements on the side closer to the substrate 101 than the interlayer insulating layer 103 are not illustrated.

Figure 2A:
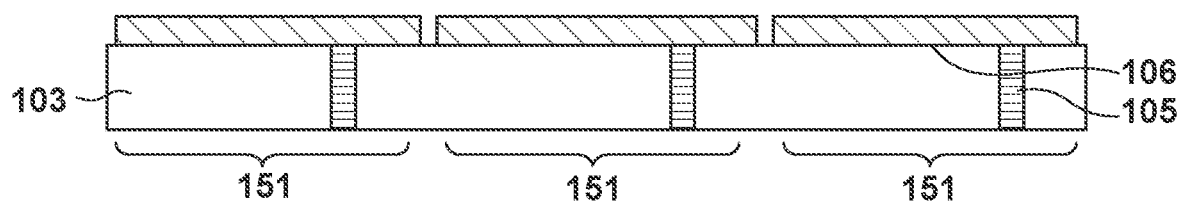
FIGS. 2A to 2D are sectional views showing a manufacturing method of the light emitting device shown in FIGS. 1A and 1B.

First, as shown in FIG. 2A, reflective layers 106 that correspond to the plurality of pixels 151, respectively, and reflect light generated by the light emitting layer arranged in the organic layer 111 are formed on the substrate 101 with the interlayer insulating layer 103 formed thereon. The reflective layers 106 are formed by, for example, depositing an AlCu film using a deposition method such as sputtering and performing a process such as a photolithography process or a dry etching process. Each reflective layer 106 is electrically connected to the element 102 such as the transistor of the corresponding pixel 151 via the conductive plug 105. Thus, each reflective layer 106 can be a conductor.

Figure 2B:
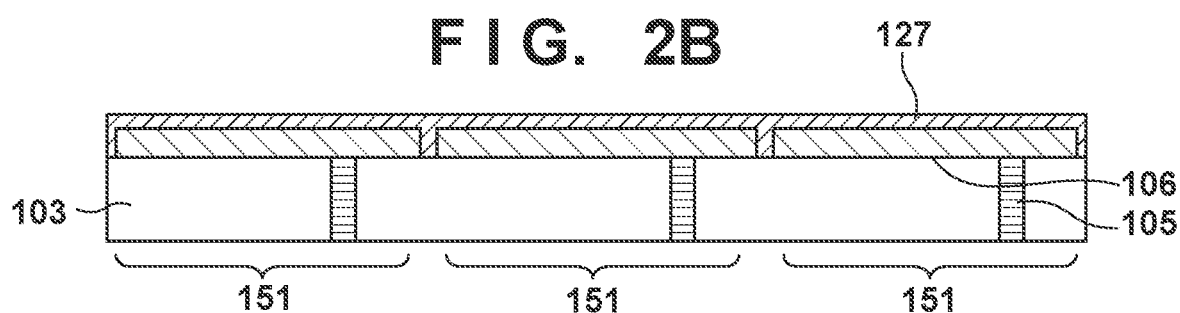

Then, as shown in FIG. 2B, an insulating layer 127 which forms a part of the optical distance adjustment layer 107 is deposited on the upper surface of the reflective layer 106 using a deposition method such as a CVD method. For example, silicon oxide can be used for the insulating layer 127.

Figure 2C:
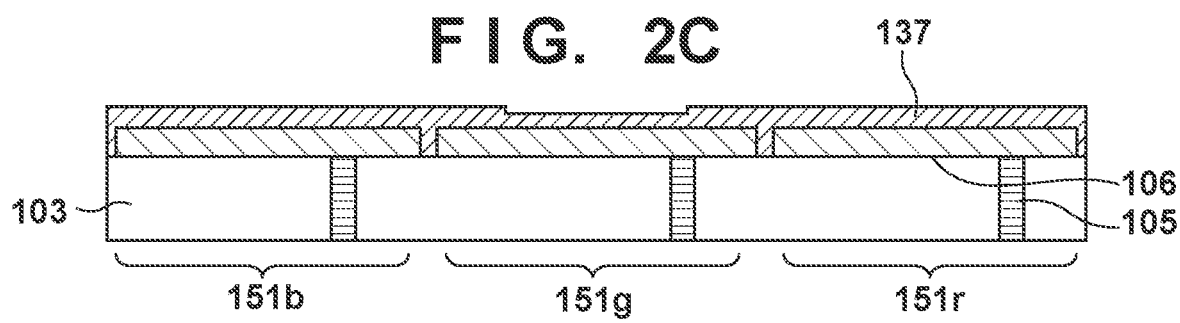

After the insulating layer 127 is deposited, the insulating layer 127 on the pixel 151*g* is etched by performing a process such as a photolithography process or a dry etching process. After the insulating layer 127 on the pixel 151*g* is etched, an insulating layer made of silicon oxide or the like, which forms a part of the optical distance adjustment layer 107, is deposited using a deposition method such as a CVD method so as to cover the insulating layer 127. Thus, an insulating layer 137 shown in FIG. 2C is formed.

Figure 2D:
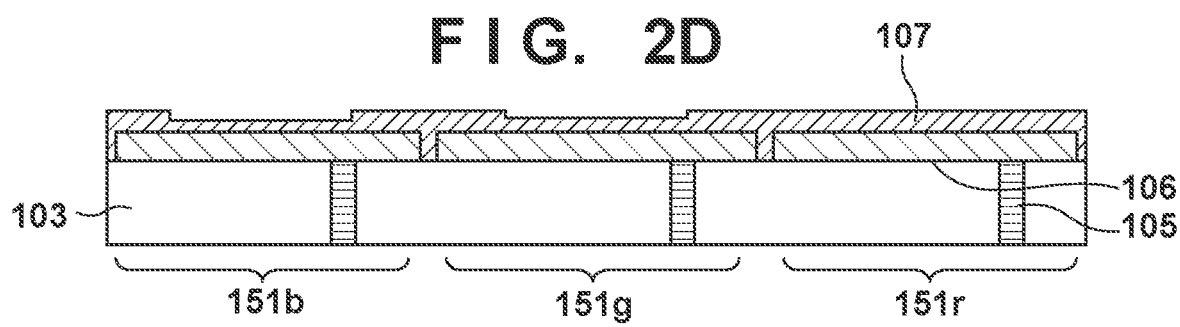

Next, the insulating layer 137 on the pixel 151*b* is etched by performing a process such as a photolithography process or a dry etching process. After the insulating layer 137 on the pixel 151*b* is etched, an insulating layer made of silicon oxide or the like, which forms a part of the optical distance adjustment layer 107, is deposited using a deposition method such as a CVD method so as to cover the insulating layer 137. Thus, the optical distance adjustment layer 107 shown in FIG. 2D is formed.

At this time, the thickness of the optical distance adjustment layer 107 is based on the optical distance with which light of a wavelength band to be transmitted through the color filter 117 in each of the pixels 151*r*, 151*g*, and 151*b* is resonated. That is, the film thickness of the optical distance adjustment layer 107 is set such that light is reflected and resonated between the reflective layer 106 and the light emitting layer in the organic layer 111 to enhance light having a specific wavelength band corresponding to the color to be transmitted through the color filter 117 in each of the pixels 151*r*, 151*g*, and 151*b*. Here, the thickness of the optical distance adjustment layer 107 is the thickness of the part of the optical distance adjustment layer 107 overlapping the opening portion 113 in an orthogonal projection with respect to the main surface 121 of the substrate 101 when the opening portion 113 is formed in the insulating layer 109 in a subsequent process. With processes described above, the optical distance adjustment layer 107 having different film thicknesses in the plurality of pixels 151*r*, 151*g*, and 151*b* is formed on the reflective layer 106.

Figure 3A:
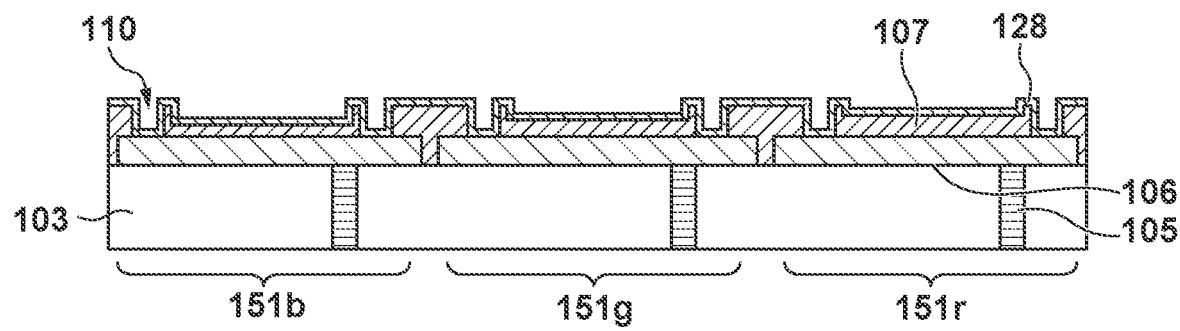
FIGS. 3A to 3C are sectional views showing the manufacturing method of the light emitting device shown in FIGS. 1A and 1B.

Then, grooves 110 are formed by performing a process such as a photolithography process or a dry etching process such that each groove 110 extends through a part of the optical distance adjustment layer 107. The groove 110 is provided so as to expose a part of the peripheral edge portion of the reflective layer 106 so that the transmission electrode 108 is arranged between the peripheral edge portion 123 of the transmission electrode 108 covered with the insulating layer 109 in a subsequent process and the reflective layer 106. After the grooves 110 are formed, as shown in FIG. 3A, as a conductive layer 128 for forming the transmission electrode 108, for example, a conductor made of ITO or the like is deposited using a deposition method such as sputtering. In the groove 110, the reflective layer 106 and the conductive layer 128 are in contact and electrically connected with each other. Further, as shown in FIG. 3A, the conductive layer 128 for forming the transmission electrode 108 may cover the inner wall of the groove 110. In this case, the transmission electrode 108 formed by the conductive layer 128 can cover the inner wall of the groove 110.

Figure 3B:
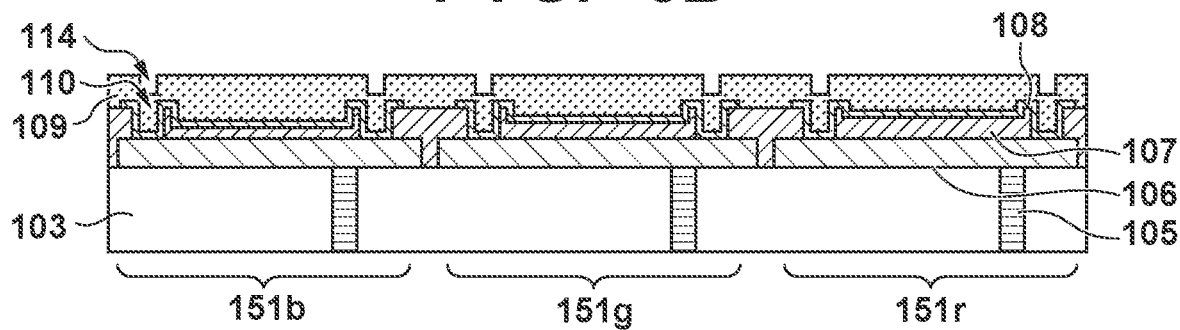

After the conductive layer 128 is formed, as shown in FIG. 3B, the transmission electrodes 108 serving as the individual electrodes corresponding to the pixels 151, respectively, are formed using a process such as a photolithography process or a dry etching process. After the transmission electrodes 108 are formed, the insulating layer 109 is formed using a deposition method such as a CVD method. For example, silicon oxide is used for the insulating layer 109. At this time, since the groove 110 is filled with the insulating layer 109, in the portion of the insulating layer 109 covering the groove 110, the recess portion 114 is formed in the surface of the insulating layer 109 along the groove 110. The insulating layer 109 may completely fill the groove 110, or the groove 110 may include a space unfilled with the insulating layer 109.

Figure 3C:
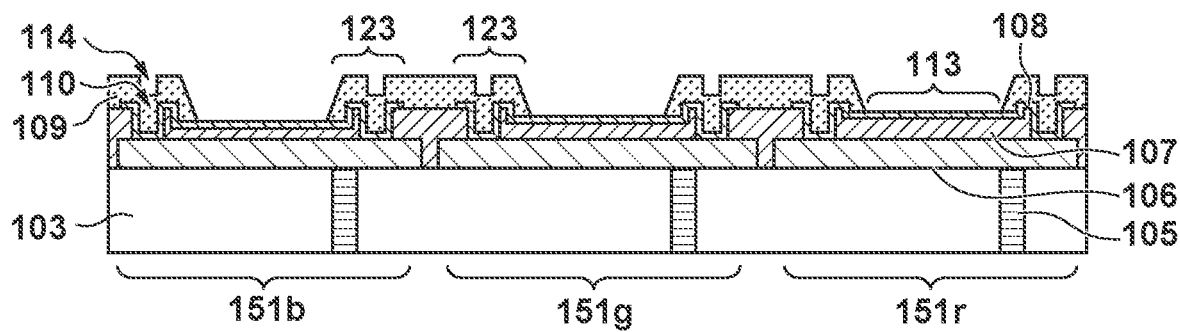

Then, as shown in FIG. 3C, opening portions 113, each of which exposes a part of the transmission electrode 108, are formed in the insulating layer 109 by performing a process such as a photolithography process or a dry etching process. In the dry etching process, the etching process is performed under a condition that the etching rate of the insulating layer 109 is much higher than the etching rate of the transmission electrode 108, and the transmission electrode 108 may function as an etching stopper. Further, as shown in FIG. 3C, the insulating layer 109 surrounding the opening portion 113 after the etching may be processed into a forward tapered shape. After the insulating layer 109 is formed, as shown in FIG. 3C, in the peripheral edge portion 123 of the transmission electrode 108 covered with the insulating layer 109, the transmission electrode 108 extends into the groove 110 and is electrically connected to the reflective layer 106.

After the opening portions 113 are formed, vacuum deposition or the like using a vapor deposition mask with an opening of desired patterning is performed, thereby forming the organic layer 111 including a light emitting layer such that it is in contact with the portions of the transmission electrodes 108 exposed by the opening portions 113. Further, the upper electrode 115, the sealing layer 116, the color filters 117, and the like are formed on the organic layer 111 using desired processes. With these processes, the light emitting device 100 including the pixels 151 as shown in FIG. 1B in the display region 201 is formed.

Figure 4:
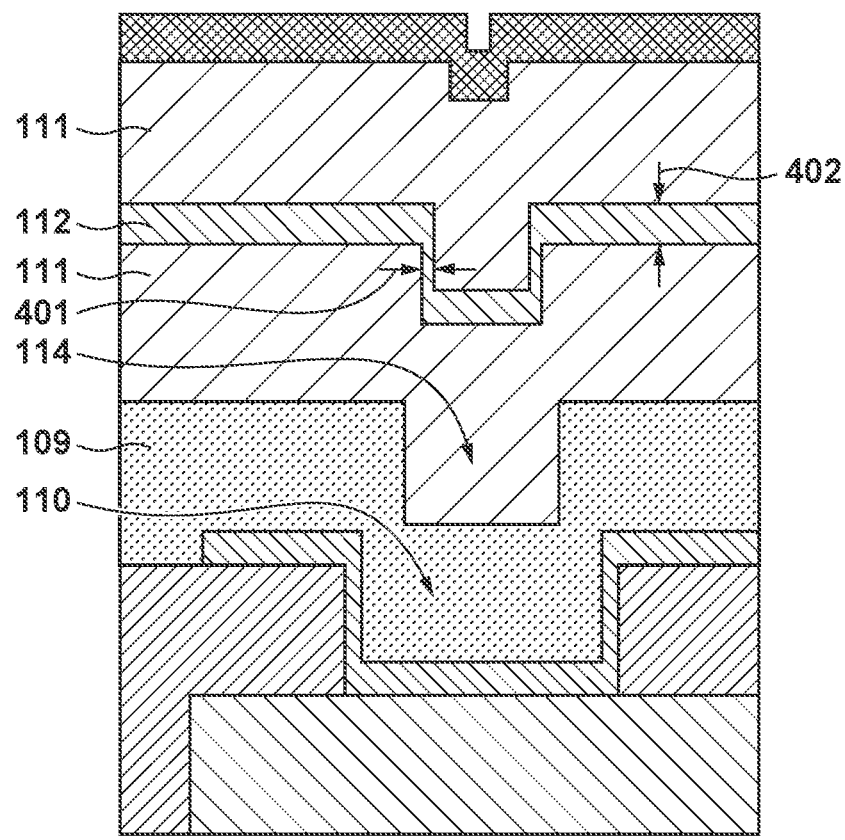
FIG. 4 is a sectional view showing the arrangement example of the light emitting device shown in FIGS. 1A and 1B.

Next, the effect of arranging the groove 110 described in this embodiment will be described with reference to FIG. 4. FIG. 4 is a view showing the vicinity of the groove 110 of the sectional view shown in FIG. 1B in an enlarged state. When the insulating layer 109 is deposited on the groove 110, in the surface of the insulating layer 109, the recess portion 114 having a shape along the groove 110 is formed in the insulating layer 109. When the organic layer 111 is further formed on the insulating layer 109, the organic layer 111 on the recess portion 114 is deposited in a recess shape due to the influence of the underlying shape. At this time, the film thickness of a portion of the carrier injection layer 112 covering the recess portion 114 becomes smaller than the film thickness of a portion of the carrier injection layer 112 other than the portion covering the recess portion 114. More specifically, a film thickness 401 of a portion of the carrier injection layer 112 covering the recess portion 114 and extending in a direction crossing the main surface 121 of the substrate 101 becomes smaller than a film thickness 402 of a portion of the carrier injection layer 112 extending in a direction parallel to the main surface 121 of the substrate 101. With this, the electric resistance of the carrier injection layer 112 becomes high on the surface crossing the main surface 121 of the substrate 101, so that a leakage current between the pixels 151 adjacent to each other across the groove 110 is suppressed. Further, not only the carrier injection layer 112 but also the entire organic layer 111 includes a portion where the film thickness is small due to the recess shape caused by the groove 110, so that a leakage current between the pixels 151 adjacent to each other can be suppressed.

The film thickness 401 of the carrier injection layer 112 can be controlled by, for example, the width of the groove 110 and the shape of the groove 110. For example, the film thickness 401 can be arbitrarily controlled by controlling the angle (taper angle) of the etched shape during forming the groove 110. The film thickness 401 of the carrier injection layer 112 can also be arbitrarily controlled not only by the width and shape of the groove 110 but also by the film thickness of the insulating layer 109 arranged so as to cover the groove 110.

Figure 5:
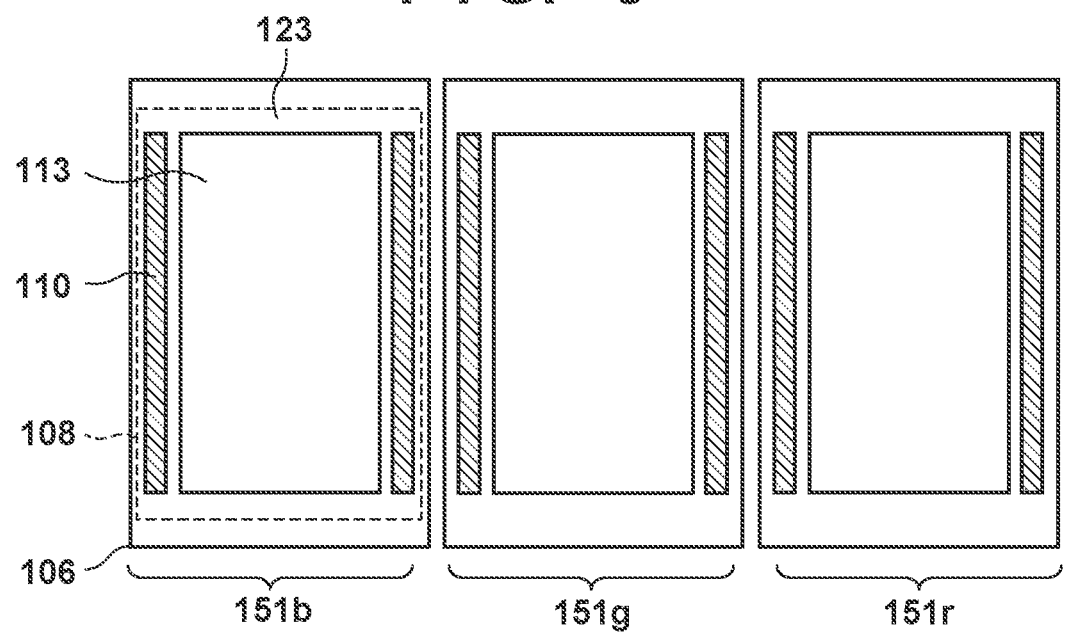
FIG. 5 is a plan view showing an arrangement example of the light emitting device shown in FIGS. 1A and 1B.

Next, the arrangement position of the groove 110 in the pixel 151 will be described with reference to FIGS. 5 to 8. FIG. 5 shows the relationship, in the pixel 151, among the reflective layer 106, the transmission electrode 108, the grooves 110, and the opening portion 113 provided in the insulating layer 109. FIG. 5 shows a case in which the plurality of pixels 151 are arranged in a line in the display region 201.

Of the transmission electrode 108 indicated by a dotted line, the portion not exposed by the opening portion 113 serves as the peripheral edge portion 123. In the orthogonal projection with respect to the main surface 121 of the substrate 101, each groove 110 is arranged so as to overlap the peripheral edge portion 123 of the transmission electrode 108 and the reflective layer 106. Further, in the orthogonal projection with respect to the main surface 121 of the substrate 101, each groove 110 includes a portion extending along the outer edge of the opening portion 113. Here, when the outer edge of the opening portion 113 forms a rectangular shape as shown in FIG. 5, the groove 110 can include a portion extending along any one of the sides of the opening portion 113. It can be said that the portion of the groove 110 arranged between the opening portions 113 respectively provided in two pixels 151 adjacent to each other extends in a direction crossing a virtual line connecting the centers of the two pixels 151. This also applies to a case in which the outer edge of the opening portion 113 forms a pentagon or a hexagon. As has been described above, since the portion where the film thickness of the organic layer 111 (carrier injection layer 112) becomes small due to the groove 110 is generated, a current flowing in the left-right direction in FIG. 5 is suppressed, so that a crosstalk phenomenon caused by a leakage current between the pixels 151 adjacent to each other in the left-right direction can be suppressed. That is, the display quality of the light emitting device 100 can be improved.

Even if the organic layer 111 does not include the carrier injection layer 112, as has been described above, the portion where the film thickness of the organic layer 111 becomes small due to the groove 110 is generated, so that a crosstalk phenomenon caused by a leakage current between the pixels 151 can be suppressed. Further, in a case in which the organic layer 111 includes not only the carrier injection layer 112 but also a highly conductive layer having a high conductivity (low resistivity), the film thickness of the highly conductive layer becomes small between the pixels 151 due to the groove 110, so that the above-described effect of suppressing a leakage current can be obtained.

In the arrangement shown in FIG. 5, the groove 110 is arranged on each of the left and right sides of the opening portion 113 provided in the pixel 151, but the present invention is not limited to this. The groove 110 may be arranged on one of the left and right sides of the opening portion 113. Alternatively, two or more grooves 110 may be arranged between the opening portion 113 and the outer edge of the transmission electrode 108.

Figure 6:
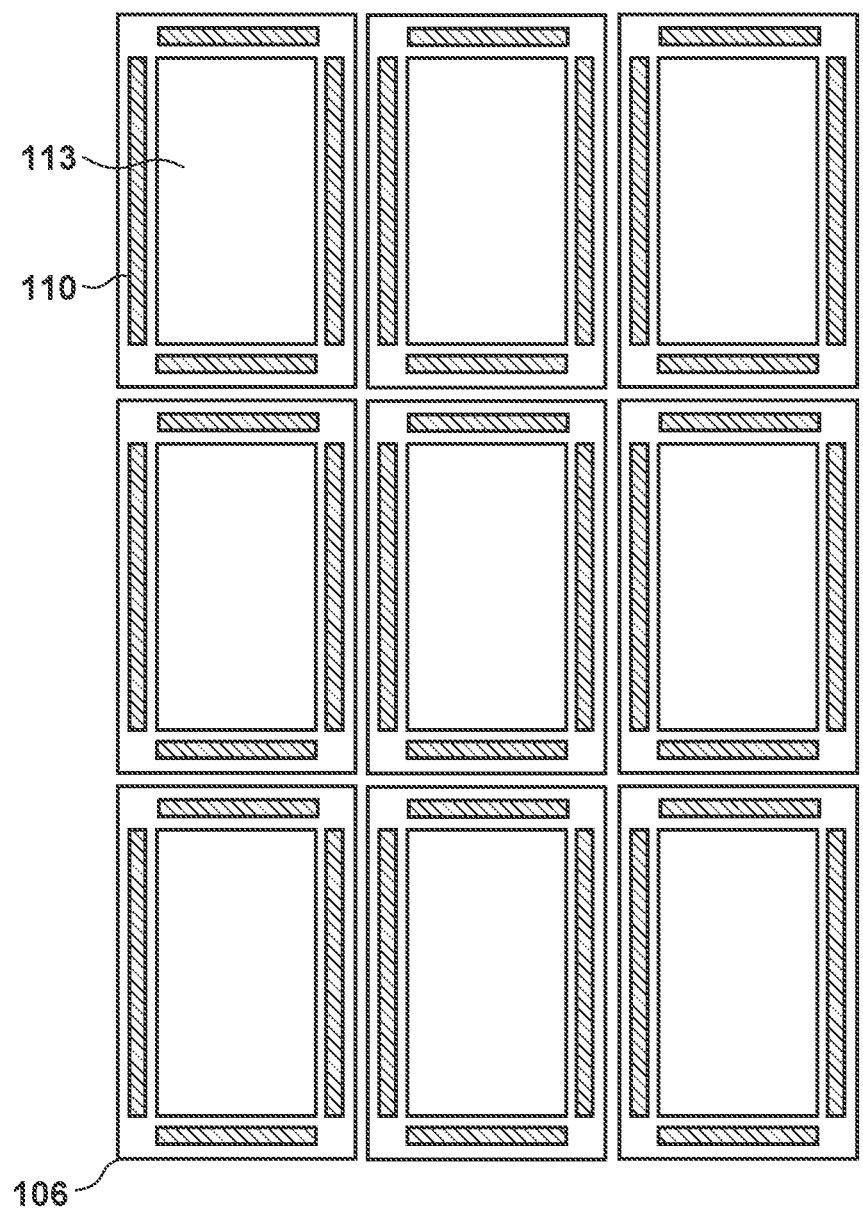
FIG. 6 is a plan view showing another arrangement example of the light emitting device shown in FIGS. 1A and 1B.
Figure 7:
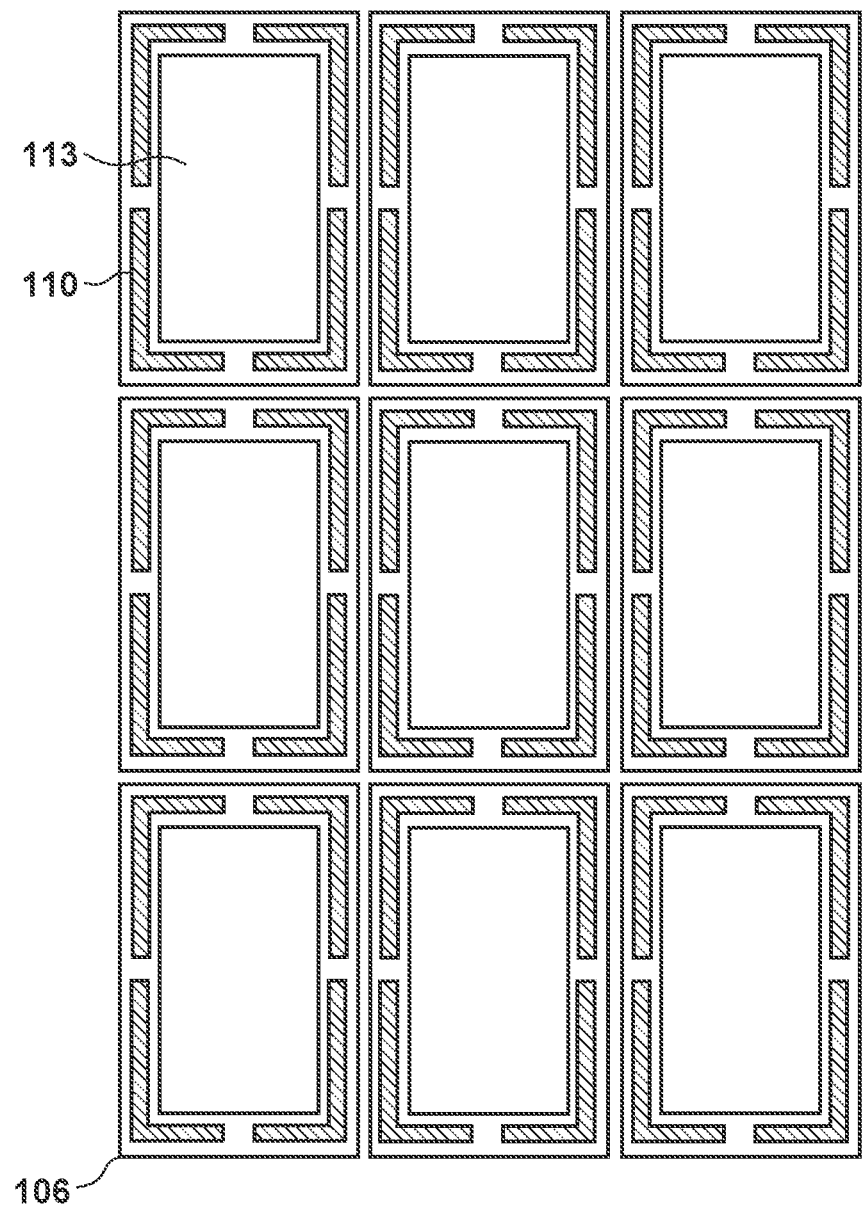
FIG. 7 is a plan view showing still another arrangement example of the light emitting device shown in FIGS. 1A and 1B.
Figure 8:
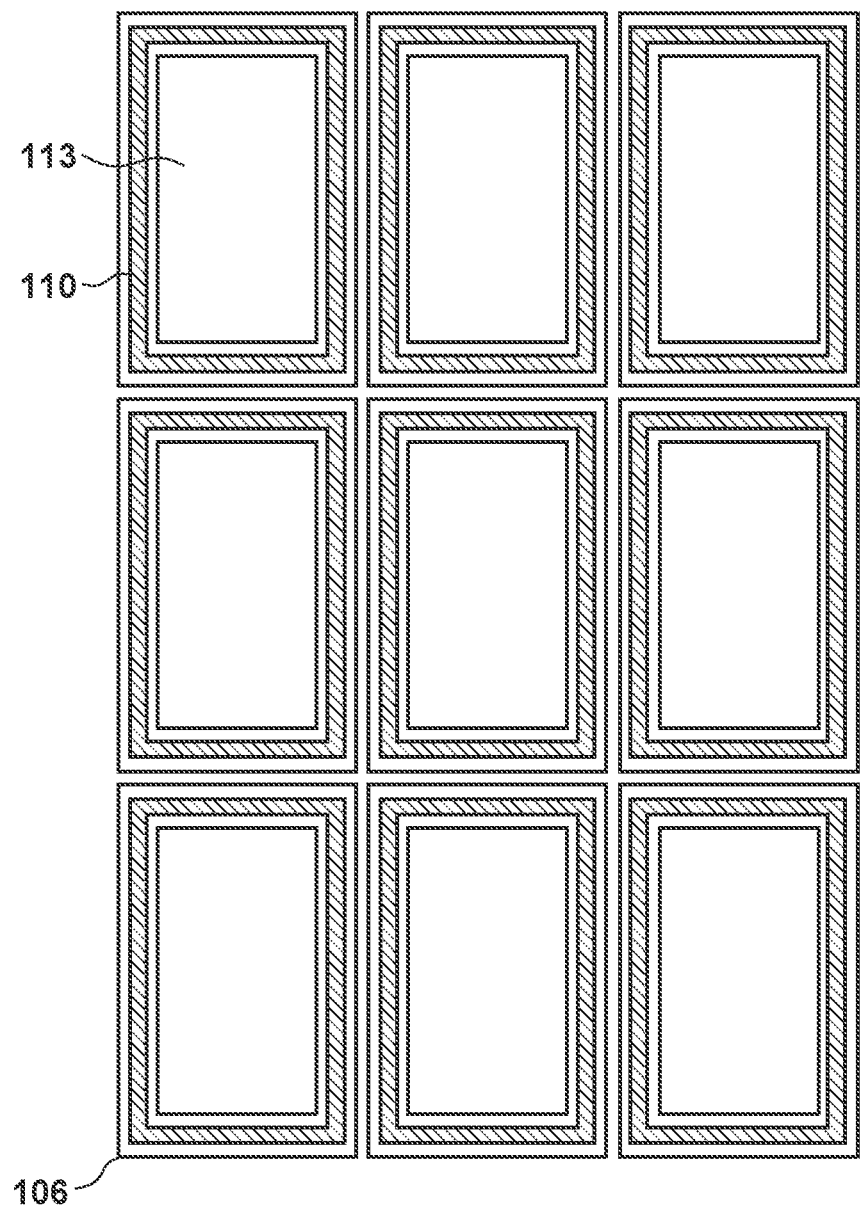
FIG. 8 is a plan view showing still another arrangement example of the light emitting device shown in FIGS. 1A and 1B.

Alternatively, as shown in FIG. 6, in a case in which the pixels 151 are arranged in a matrix, the grooves 110 may be arranged so as to continuously or intermittently surround the opening portion 113 in the orthogonal projection with respect to the main surface 121 of the substrate 101. At this time, as shown in FIG. 6, the grooves 110 may be arranged so as to correspond to the respective sides forming the outer edge of the opening portion 113. Alternatively, as shown in FIG. 7, the grooves 110 may be arranged so as to correspond to the respective corners forming the outer edge of the opening portion 113. Also in the arrangement shown in FIG. 7, the groove 110 includes a portion extending along the side forming the outer edge of the opening portion 113. Alternatively, as shown in FIG. 8, the groove 110 may be arranged so as to continuously surround the whole circumference of the opening portion 113.

In this embodiment, each of the reflective layer 106, the transmission electrode 108, and the opening portion 113 provided in the insulating layer 109 has a rectangular shape, but the present invention is not limited to this. For example, each of the reflective layer 106, the transmission electrode 108, and the opening portion 113 provided in the insulating layer 109 may have a hexagonal shape or a circular shape. As long as the groove 110 is arranged between the pixels 151, the above-described effect can be obtained.

In this embodiment, due to the groove 110 that exposes the reflective layer 106, the reflective layer 106 and the transmission electrode 108 are electrically connected, and the recess portion 114 is generated in the portion of the insulating layer 109 covering the groove 110. With this, a leakage current flowing between the pixels 151 via the organic layer 111 can be reduced, so that a crosstalk phenomenon can be suppressed. In this embodiment, the recess portion 114 is formed on the insulating layer 109 by using the groove 110 configured to connect the reflective layer 106 and the transmission electrode 108. Therefore, in this embodiment, the recess portion 114 on the insulating layer 109 for partially decreasing the film thickness of the organic layer 111 is arranged so as to overlap the groove 110 in the orthogonal projection with respect to the main surface 121 of the substrate 101. Accordingly, as compared to a case in which the recess portion for decreasing the film thickness of the organic layer 111 is provided between the pixels 151 adjacent to each other, miniaturization of the pixels 151 is facilitated. As a result, higher resolution and improvement of the display quality of the light emitting device 100 can be implemented.

A modification of the light emitting device 100 described above will be described with reference to FIGS. 9A to 11. Here, in FIGS. 9A to 10C, the constituent elements closer to the main surface 121 of the substrate 101 than the reflective layer 106 may be the same as in FIG. 1B. Hence, some of the constituent elements on the side closer to the substrate 101 than the interlayer insulating layer 103 are not illustrated. The arrangement different from the above-described light emitting device 100 will be mainly described, and a description of the arrangement that may be similar to the arrangement of the above-described light emitting device 100 will be omitted as appropriate.

Figure 9A:
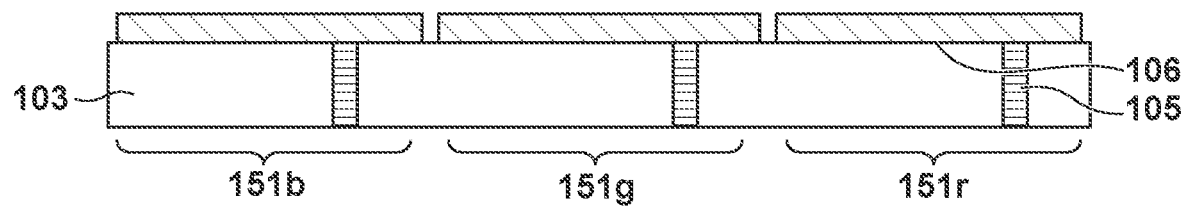
FIGS. 9A to 9D are sectional views showing a manufacturing method of a modification of the light emitting device shown in FIGS. 1A and 1B.

First, as shown in FIG. 9A, reflective layers 106 that correspond to the plurality of pixels 151, respectively, and reflect light generated by the light emitting layer arranged in the organic layer 111 are formed on the substrate 101 with the interlayer insulating layer 103 formed thereon.

Figure 9B:
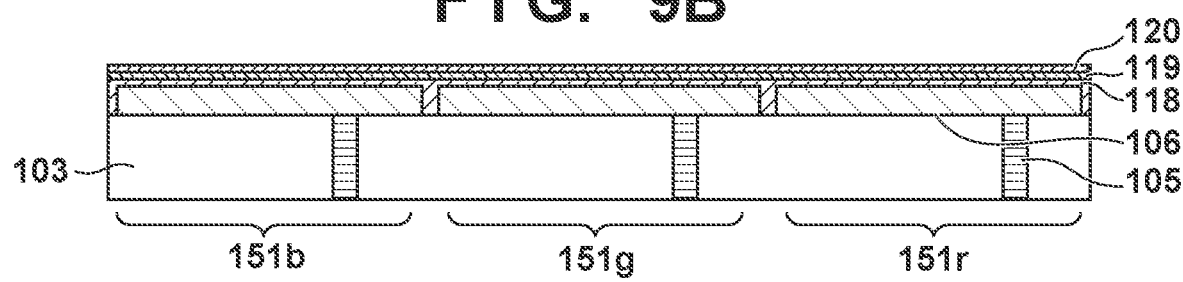

Then, as shown in FIG. 9B, insulating layers 118, 119, and 120, which form the optical distance adjustment layer 107, are stacked on the upper surface of the reflective layer 106. For example, silicon nitride may be used for the insulating layer 118. For example, silicon oxide may be used for the insulating layers 119 and 120. Silicon nitride and silicon oxide can be deposited using, for example, a CVD method.

Figure 9C:
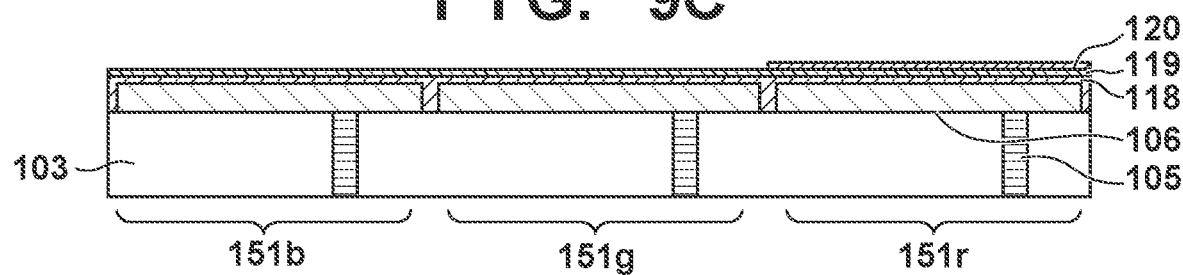

After the insulating layers 118, 119, and 120 are formed, as shown in FIG. 9C, the insulating layer 120 on the pixels 151*b* and the pixel 151*g* is etched by partially performing a process such as a photolithography process or a dry etching process. For example, the insulating layers 119 and 120 may be formed as one insulating layer in the process shown in FIG. 9B. In this case, in the process shown in FIG. 9C, the portion indicated as the insulating layer 120 may be etched on the pixel 151*b* and the pixel 151*g* by controlling the etching time. Alternatively, for example, the insulating layers 119 and 120 may be layers having etching characteristics different from each other, and the insulating layer 120 may be etched using the insulating layer 119 as an etching stopper.

Figure 9D:
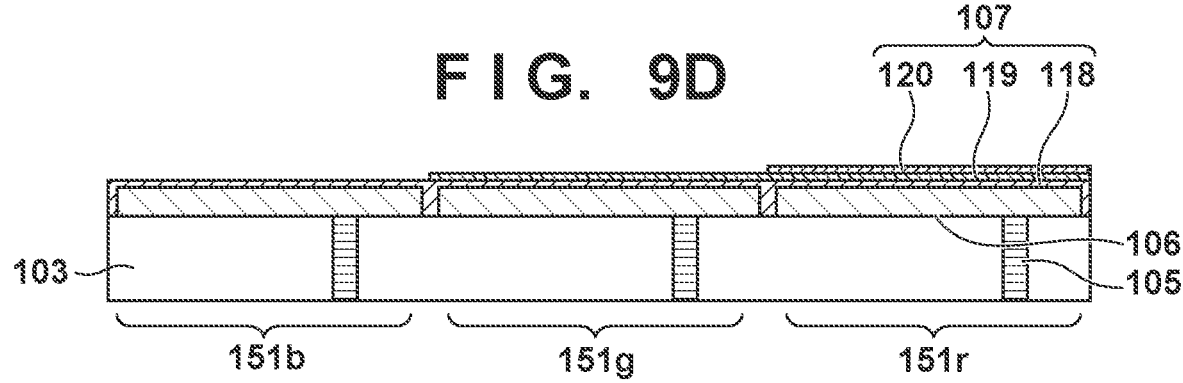

Then, as shown in FIG. 9D, the insulating layer 119 on the pixel 151*b* is etched by partially performing a process such as a photolithography process or a dry etching process. With processes described above, the optical distance adjustment layer 107 having different film thicknesses in the plurality of pixels 151*r*, 151*g*, and 151*b* is formed on the reflective layer 106.

Figure 10A:
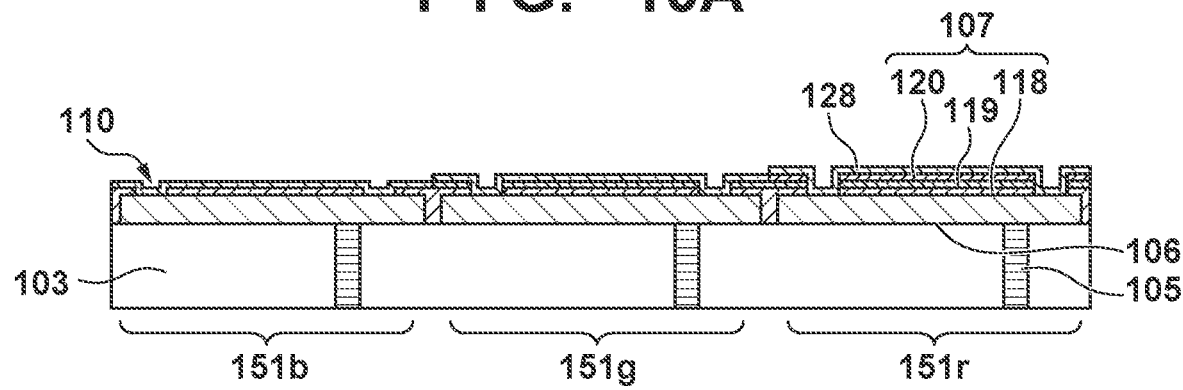
FIGS. 10A to 10C are sectional views showing the manufacturing method of the modification of the light emitting device shown in FIGS. 1A and 1B.

Then, grooves 110 are formed by performing a process such as a photolithography process or a dry etching process such that each groove 110 extends through a part of the optical distance adjustment layer 107. After the grooves 110 are formed, as shown in FIG. 10A, as the conductive layer 128 for forming the transmission electrode 108, for example, a conductor made of ITO or the like is deposited using a deposition method such as sputtering. In FIG. 10A, the reflective layer 106 is in direct contact with the transmission electrode 108 in the lower portion of the groove 110, but a conductive film (not shown) may be arranged between the reflective layer 106 and the transmission electrode 108. For example, when Al is used for the reflective layer 106 and ITO is used for the transmission electrode 108, the contact resistance between the reflective layer 106 and the transmission electrode 108 may become high. In order to decrease the contact resistance between the reflective layer 106 and the transmission electrode 108, a conductive layer made of TiN or the like may be arranged between the reflective layer 106 and the transmission electrode 108.

Figure 10B:
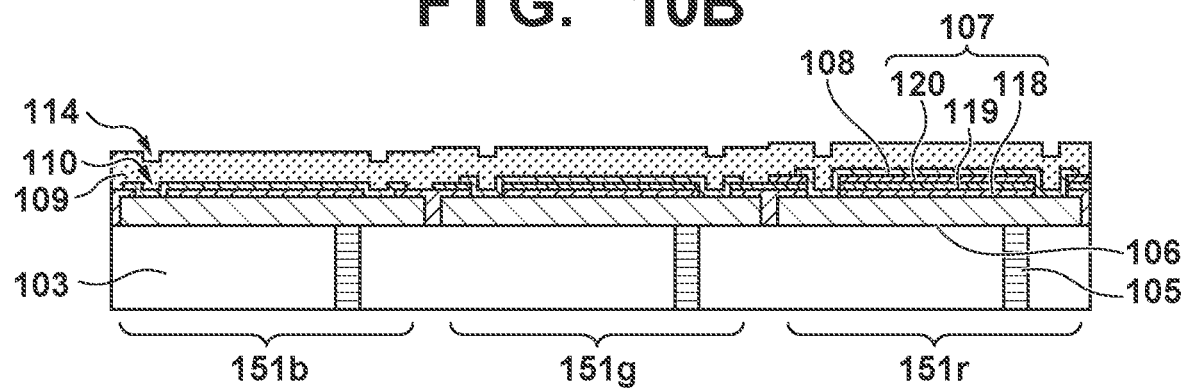

After the conductive layer 128 is formed, as shown in FIG. 10B, the transmission electrodes 108 corresponding to the pixels 151, respectively, are formed using a process such as a photolithography process or a dry etching process. After the transmission electrodes 108 are formed, the insulating layer 109 is formed. At this time, in the portion of the insulating layer 109 covering the groove 110, the recess portion 114 is formed in the surface of the insulating layer 109 along the groove 110.

Figure 10C:
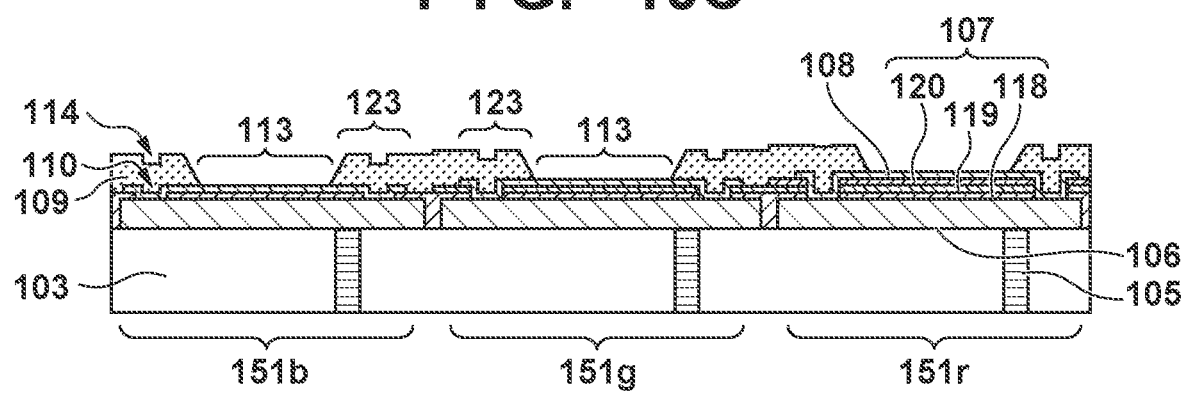

Then, as shown in FIG. 10C, opening portions 113, each of which exposes a part of the transmission electrode 108, are formed in the insulating layer 109 by performing a process such as a photolithography process or a dry etching process. After the opening portions 113 are formed, vacuum deposition or the like using a vapor deposition mask with an opening of desired patterning is performed, thereby forming the organic layer 111 including a light emitting layer such that it is in contact with the portions of the transmission electrodes 108 exposed by the opening portions 113. Further, the upper electrode 115, the sealing layer 116, the color filters 117, and the like are formed on the organic layer 111 using desired processes. With these processes, a light emitting device 100' including the pixels 151 as shown in FIG. 11 in the display region 201 is formed.

Also in the light emitting device 100' shown in FIG. 11, an effect similar to that of the light emitting device 100 described above can be obtained. That is, a leakage current flowing between the pixels 151 via the organic layer 111 can be reduced, so that a crosstalk phenomenon can be suppressed. Further, since the recess portion 114 of the insulating layer 109 is arranged at the position overlapping the groove 110, miniaturization of the pixels 151 can be achieved. As a result, as in the light emitting device 100, higher resolution and improvement of the display quality can be implemented also in the light emitting device 100'.

Application examples in which the light emitting device 100 or 100' according to this embodiment including light emitting elements such as organic EL elements arranged therein is applied to a display device, a photoelectric conversion device, an electronic apparatus, an illumination device, a moving body, and a wearable device will be described here with reference to FIGS. 12 to 18A and 18B. Details of the components of the above-described light emitting device 100 or 100' and modifications will be described first, and the application examples will be described after that.

Arrangement of Organic Light Emitting Element

The organic light emitting element is provided by forming an insulating layer, a first electrode, an organic compound layer, and a second electrode on a substrate. A protection layer, a color filter, a microlens, and the like may be provided on a cathode. If a color filter is provided, a planarizing layer can be provided between the protection layer and the color filter. The planarizing layer can be made of acrylic resin or the like. The same applies to a case in which a planarizing layer is provided between the color filter and the microlens.

Substrate

Quartz, glass, a silicon wafer, a resin, a metal, or the like may be used as a substrate. Furthermore, a switching element such as a transistor and a wiring may be provided on the substrate, and an insulating layer may be provided thereon. The insulating layer may be made of any material as long as a contact hole can be formed so that the wiring can be formed between the insulating layer and the first electrode and insulation from the unconnected wiring can be ensured. For example, a resin such as polyimide, silicon oxide, silicon nitride, or the like can be used.

Electrode

A pair of electrodes can be used as the electrodes. The pair of electrodes can be an anode and a cathode. If an electric field is applied in the direction in which the organic light emitting element emits light, the electrode having a high potential is the anode, and the other is the cathode. It can also be said that the electrode that supplies holes to the light emitting layer is the anode and the electrode that supplies electrons is the cathode.

As the constituent material of the anode, a material having a work function as large as possible may be used. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used.

One of these electrode materials may be used singly, or two or more of them may be used in combination. The anode may be formed by a single layer or a plurality of layers.

If the anode is used as a reflective electrode, for example, chromium, aluminum, silver, titanium, tungsten, molybdenum, an alloy thereof, a stacked layer thereof, or the like can be used. The above materials can function as a reflective film having no role as an electrode. If the anode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function may be used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multi-layer structure. Among others, silver may be used. To suppress aggregation of silver, a silver alloy is more suitable for use. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but direct current sputtering or alternating current sputtering is suitable since the good film coverage is provided and the resistance is easily lowered.

Organic Compound Layer

The organic compound layer may be formed by a single layer or a plurality of layers. If the organic compound layer includes a plurality of layers, the layers can be called a hole injection layer, a hole transport layer, an electron blocking layer, a light emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer can be arranged between the first and second electrodes, and may be arranged in contact with the first and second electrodes.

Protection Layer

A protection layer may be provided on the cathode. For example, by adhering glass provided with a moisture absorbing agent on the cathode, permeation of water or the like into the organic compound layer can be suppressed and occurrence of display defects can be suppressed. Furthermore, as another embodiment, a passivation film made of silicon nitride or the like may be provided on the cathode to suppress permeation of water or the like into the organic compound layer. For example, the protection layer can be formed by forming the cathode, transferring it to another chamber without breaking the vacuum, and forming a silicon nitride film having a thickness of 2 μm by a CVD method. The protection layer may be provided using an atomic layer deposition method (ALD method) after forming a film using the CVD method. The material of the film by the ALD method is not limited but can be silicon nitride, silicon oxide, aluminum oxide, or the like. A silicon nitride film may further be formed by the CVD method on the film formed by the ALD method. The film formed by the ALD method may have a film thickness smaller than that of the film formed by the CVD method. More specifically, the film thickness of the film formed by the ALD method may be 50% or less, or 10% or less.

Color Filter

A color filter may be provided on the protection layer. For example, a color filter considering the size of the organic light emitting element may be provided on another substrate, and this substrate may be bonded to the substrate with the organic light emitting element provided thereon. Alternatively, a color filter may be patterned on the above-described protection layer using a photolithography technique. The color filter can be formed from a polymeric material.

Planarizing Layer

A planarizing layer may be provided between the color filter and the protection layer. The planarizing layer is provided to reduce unevenness of the lower layer. The planarizing layer may be called a material resin layer without limiting the purpose of the layer. The planarizing layer can be formed from an organic compound, and can be made of a low-molecular material or a polymeric material. However, a polymetric material is more suitable.

The planarizing layers may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

Microlens

The light emitting device can include an optical member such as a microlens on the light emission side. The microlens can be made of acrylic resin, epoxy resin, or the like. The microlens can aim to increase the amount of light extracted from the light emitting device and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. That is, among tangents contacting the semicircle of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for determining the vertex and the middle point may be a section perpendicular to the insulating layer.

Counter Substrate

A counter substrate can be provided on the planarizing layer. The counter substrate is called a counter substrate because it is provided at a position corresponding to the above-described substrate. The constituent material of the counter substrate can be the same as that of the above-described substrate. If the above-described substrate is the first substrate, the counter substrate can be the second substrate.

Organic Layer

The organic compound layer (hole injection layer, hole transport layer, electron blocking layer, light emitting layer, hole blocking layer, electron transport layer, electron injection layer, and the like) forming the organic light emitting element according to an embodiment of the present invention is formed by the method to be described below.

The organic compound layer forming the organic light emitting element according to the embodiment of the present invention can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

Pixel Circuit

The light emitting device can include a pixel circuit connected to the light emitting element. The pixel circuit may be an active matrix circuit that individually controls light emission of the first and second light emitting elements. The active matrix circuit may be a voltage or current programing circuit. A driving circuit includes a pixel circuit for each pixel. The pixel circuit can include a light emitting element, a transistor for controlling light emission luminance of the light emitting element, a transistor for controlling a light emission timing, a capacitor for holding the gate voltage of the transistor for controlling the light emission luminance, and a transistor for connection to GND without intervention of the light emitting element.

The light emitting device includes a display region and a peripheral region arranged around the display region. The light emitting device includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

Pixel

The organic light emitting device includes a plurality of pixels. Each pixel includes sub-pixels that emit light components of different colors. The sub-pixels include, for example, R, G, and B emission colors, respectively.

In each pixel, a region also called a pixel opening emits light. This region is the same as the first region. The pixel opening can have a size of 5 μm (inclusive) to 15 μm (inclusive). More specifically, the pixel opening can have a size of 11 μm, 9.5 μm, 7.4 μm, 6.4 μm, or the like.

A distance between the sub-pixels can be 10 μm or less, and can be, more specifically, 8 μm, 7.4 μm, or 6.4 μm.

The pixels can have a known arrangement form in a plan view. For example, the pixels may have a stripe arrangement, a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle, as a matter of course. The shape of the sub-pixel and the pixel arrangement can be used in combination.

Application of Organic Light Emitting Element of Embodiment of Present Invention The organic light emitting element according to an embodiment of the present invention can be used as a constituent member of a display device or an illumination device. In addition, the organic light emitting element is applicable to the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

Details will be described below with reference to FIGS. 12 to 18A and 18B.

Figure 12:
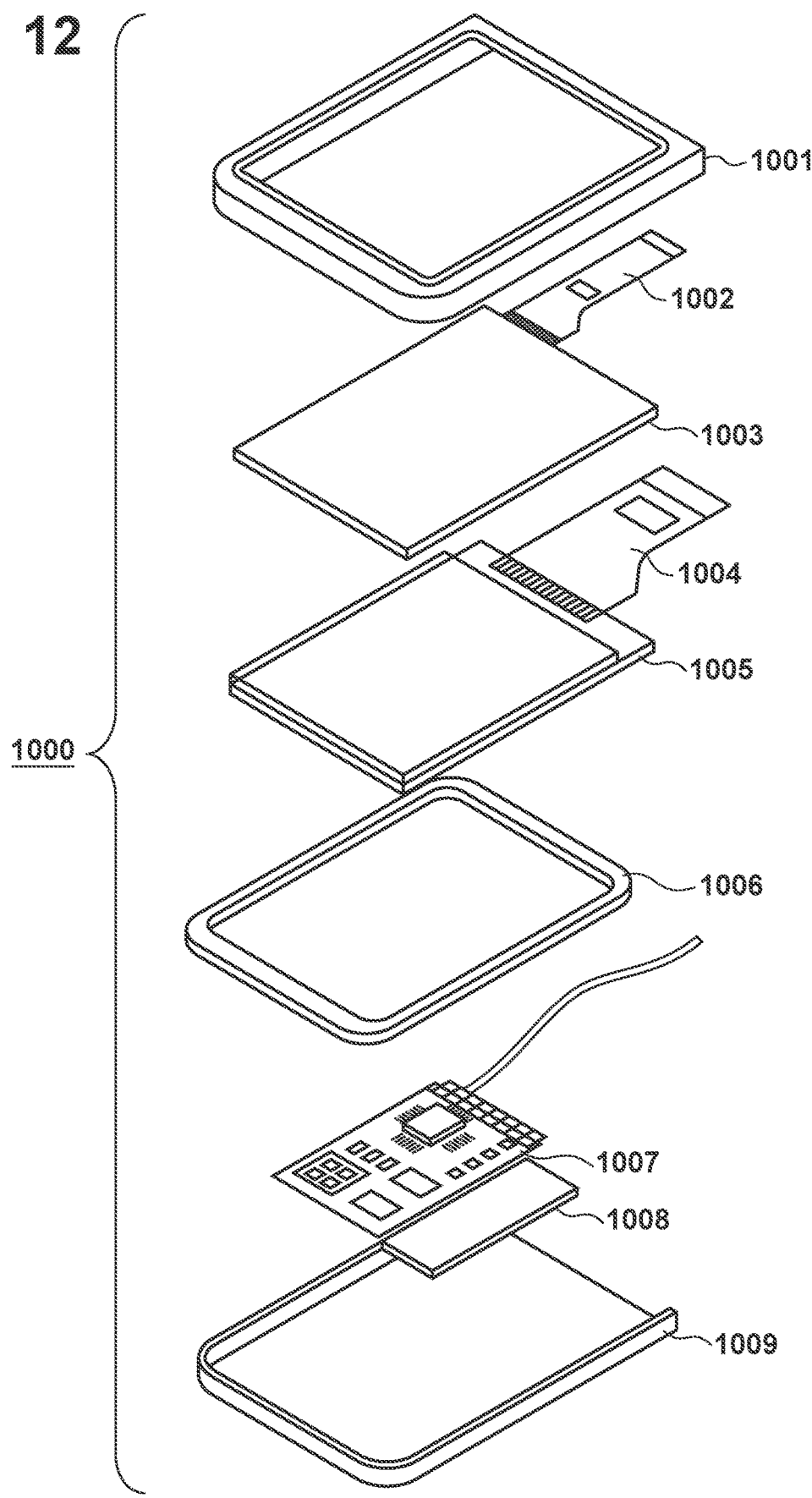
FIG. 12 is a view showing an example of a display device using the light emitting device according to the embodiment.

FIG. 12 is a schematic view showing an example of the display device using the light emitting device 100 or 100' of this embodiment. A display device 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Active elements such as transistors are arranged on the circuit board 1007. The battery 1008 is unnecessary if the display device 1000 is not a portable apparatus. Even when the display device 1000 is a portable apparatus, the battery 1008 need not be provided at this position. The light emitting device 100 or 100' can be applied to the display panel 1005. The display region 201 of the light emitting device 100 or 100' functioning as the display panel 1005 operates in a state in which it is connected to the active elements such as transistors arranged on the circuit board 1007.

The display device 1000 shown in FIG. 12 can be used for a display unit of a photoelectric conversion device (image capturing device) including an optical unit having a plurality of lenses, and an image sensor for receiving light having passed through the optical unit and photoelectrically converting the light into an electric signal. The photoelectric conversion device can include a display unit for displaying information acquired by the image sensor. In addition, the display unit can be either a display unit exposed outside the photoelectric conversion device, or a display unit arranged in the finder. The photoelectric conversion device can be a digital camera or a digital video camera.

Figure 13:
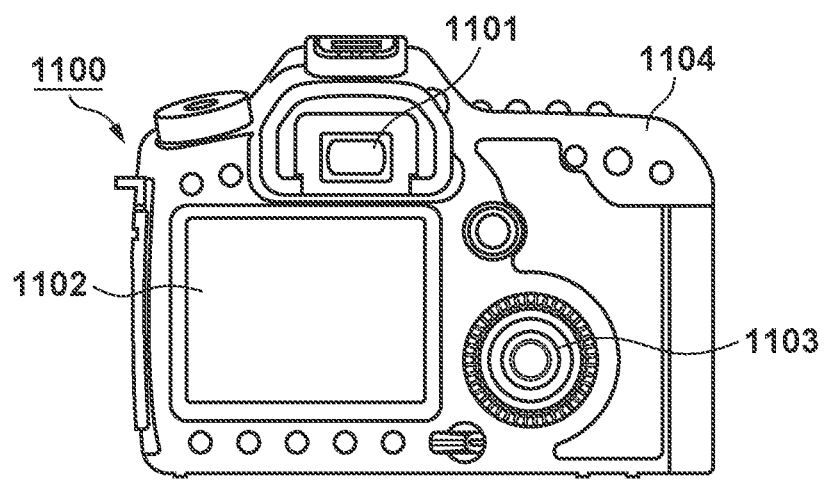
FIG. 13 is a view showing an example of a photoelectric conversion device using the light emitting device according to the embodiment.

FIG. 13 is a schematic view showing an example of the photoelectric conversion device using the light emitting device 100 or 100' of this embodiment. A photoelectric conversion device 1100 can include a viewfinder 1101, a rear display 1102, an operation unit 1103, and a housing 1104. The photoelectric conversion device 1100 can also be called an image capturing device. The light emitting device 100 or 100' according to this embodiment can be applied to the viewfinder 1101 or the rear display 1102 as a display unit. In this case, the display region 201 of the light emitting device 100 or 100' can display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time in many cases, so the information should be displayed as soon as possible. Therefore, the light emitting device 100 or 100' in which the pixels 151 such as organic EL elements using the organic light emitting material are arranged in the display region 201 may be used for the viewfinder 1101 or the rear display 1102. This is so because the organic light emitting material has a high response speed. The light emitting device 100 or 100' using the organic light emitting material can be used for the apparatuses that require a high display speed more suitably than for the liquid crystal display device.

The photoelectric conversion device 1100 includes an optical unit (not shown). This optical unit has a plurality of lenses, and forms an image on a photoelectric conversion element (not shown) that receives light having passed through the optical unit and is accommodated in the housing 1104. The focal points of the plurality of lenses can be adjusted by adjusting the relative positions. This operation can also automatically be performed.

The light emitting device 100 or 100' may be applied to a display unit of an electronic apparatus. At this time, the display unit can have both a display function and an operation function. Examples of the portable terminal are a portable phone such as a smartphone, a tablet, and a head mounted display.

Figure 14:
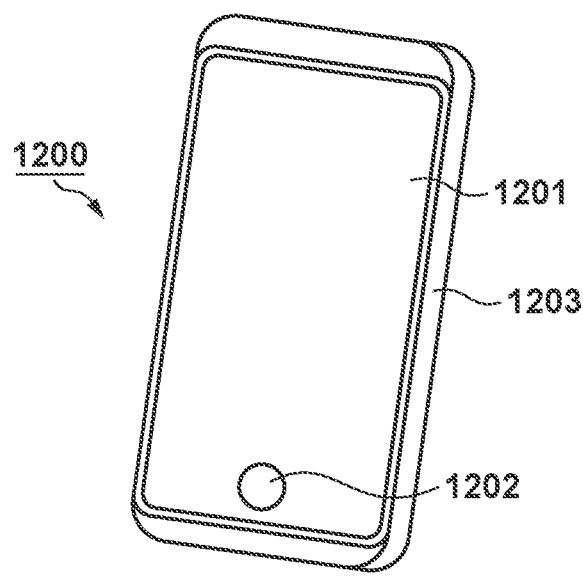
FIG. 14 is a view showing an example of an electronic apparatus using the light emitting device according to the embodiment.

FIG. 14 is a schematic view showing an example of an electronic apparatus using the light emitting device 100 or 100' of this embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 can be a button or a touch-panel-type reaction unit. The operation unit 1202 can also be a biometric authentication unit that performs unlocking or the like by authenticating the fingerprint. The portable apparatus including the communication unit can also be regarded as a communication apparatus. The light emitting device 100 or 100' according to this embodiment can be applied to the display unit 1201.

Figure 15A:
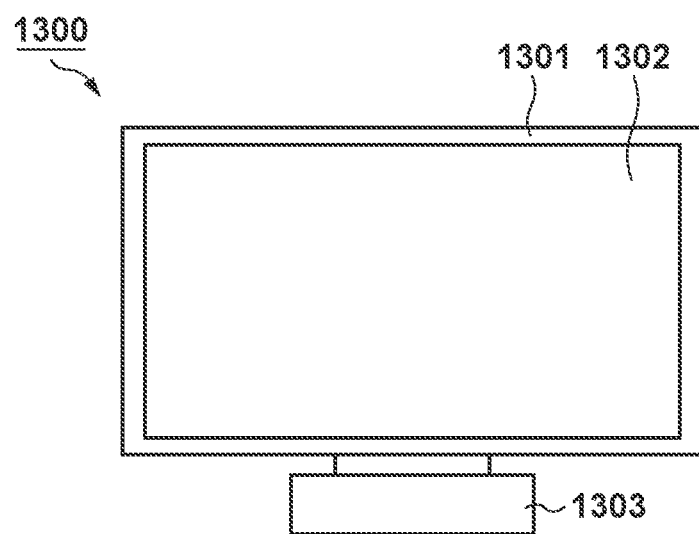
FIGS. 15A and 15B are views each showing an example of a display device using the light emitting device according to the embodiment.
Figure 15B:
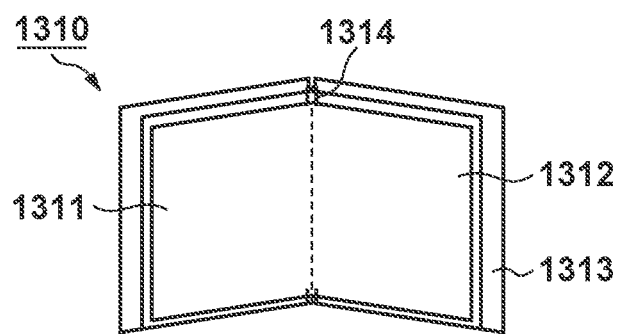

FIGS. 15A and 15B are schematic views showing examples of the display device using the light emitting device 100 or 100' of this embodiment. FIG. 15A shows a display device such as a television monitor or a PC monitor. A display device 1300 includes a frame 1301 and a display unit 1302. The light emitting device 100 or 100' according to this embodiment can be applied to the display unit 1302. The display device 1300 can include a base 1303 that supports the frame 1301 and the display unit 1302. The base 1303 is not limited to the form shown in FIG. 15A. For example, the lower side of the frame 1301 may also function as the base 1303. In addition, the frame 1301 and the display unit 1302 can be bent. The radius of curvature in this case can be 5,000 mm (inclusive) to 6,000 mm (inclusive).

FIG. 15B is a schematic view showing another example of the display device using the light emitting device 100 or 100' of this embodiment. A display device 1310 shown in FIG. 15B can be folded, and is a so-called foldable display device. The display device 1310 includes a first display unit 1311, a second display unit 1312, a housing 1313, and a bending point 1314. The light emitting device 100 or 100' according to this embodiment can be applied to each of the first display unit 1311 and the second display unit 1312. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 16:
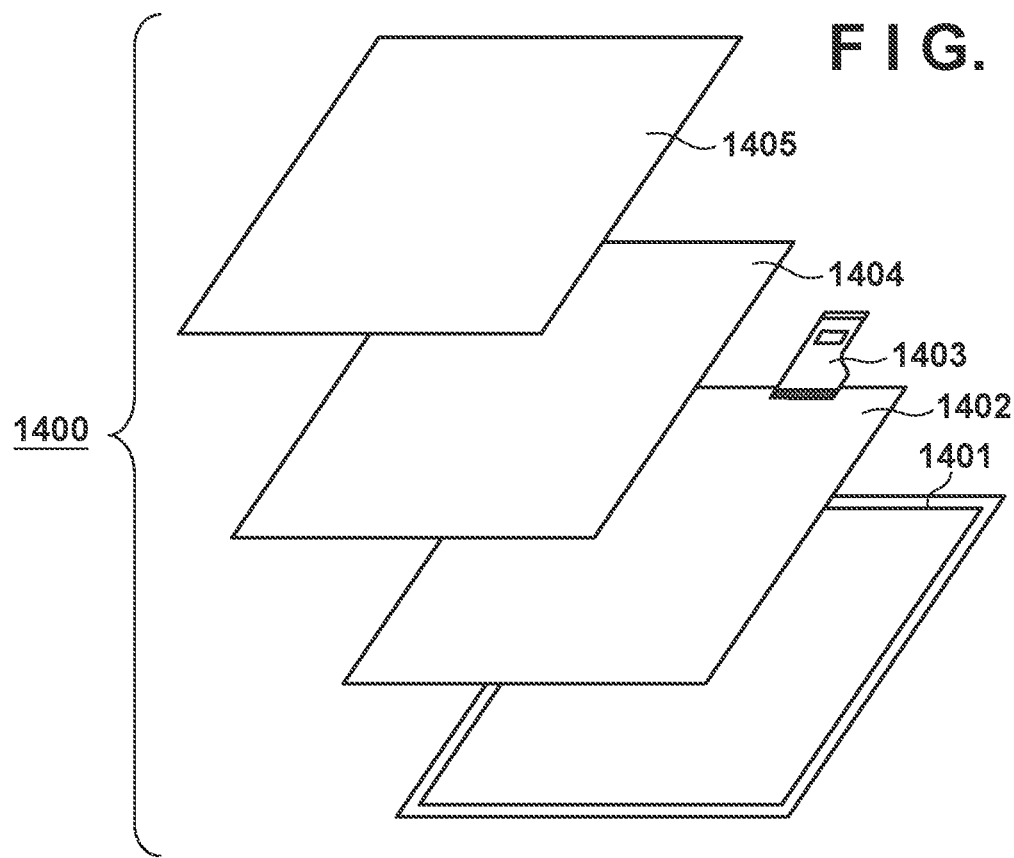
FIG. 16 is a view showing an example of an illumination device using the light emitting device according to the embodiment.

FIG. 16 is a schematic view showing an example of the illumination device using the light emitting device 100 or 100' of this embodiment. An illumination device 1400 can include a housing 1401, a light source 1402, a circuit board 1403, an optical film 1404, and a light diffusing unit 1405. The light emitting device 100 or 100' according to this embodiment can be applied to the light source 1402. The optical film 1404 can be a filter that improves the color rendering of the light source. When performing lighting-up or the like, the light diffusing unit 1405 can throw the light of the light source over a broad range by effectively diffusing the light. The illumination device can also include a cover on the outermost portion, as needed. The illumination device 1400 can include both or one of the optical film 1404 and the light diffusing unit 1405.

The illumination device 1400 is, for example, a device for illuminating the interior of the room. The illumination device 1400 can emit white light, natural white light, or light of any color from blue to red. The illumination device 1400 can also include a light control circuit for controlling these light components. The illumination device 1400 can also include a power supply circuit connected to the display region 201 of the light emitting device 100 or 100' functioning as the light source 1402. The power supply circuit is a circuit for converting an AC voltage into a DC voltage. White has a color temperature of 4,200 K, and natural white has a color temperature of 5,000 K. The illumination device 1400 may also include a color filter. In addition, the illumination device 1400 can include a heat radiation unit. The heat radiation unit radiates the internal heat of the device to the outside of the device, and examples are a metal having a high specific heat and liquid silicon.

Figure 17:
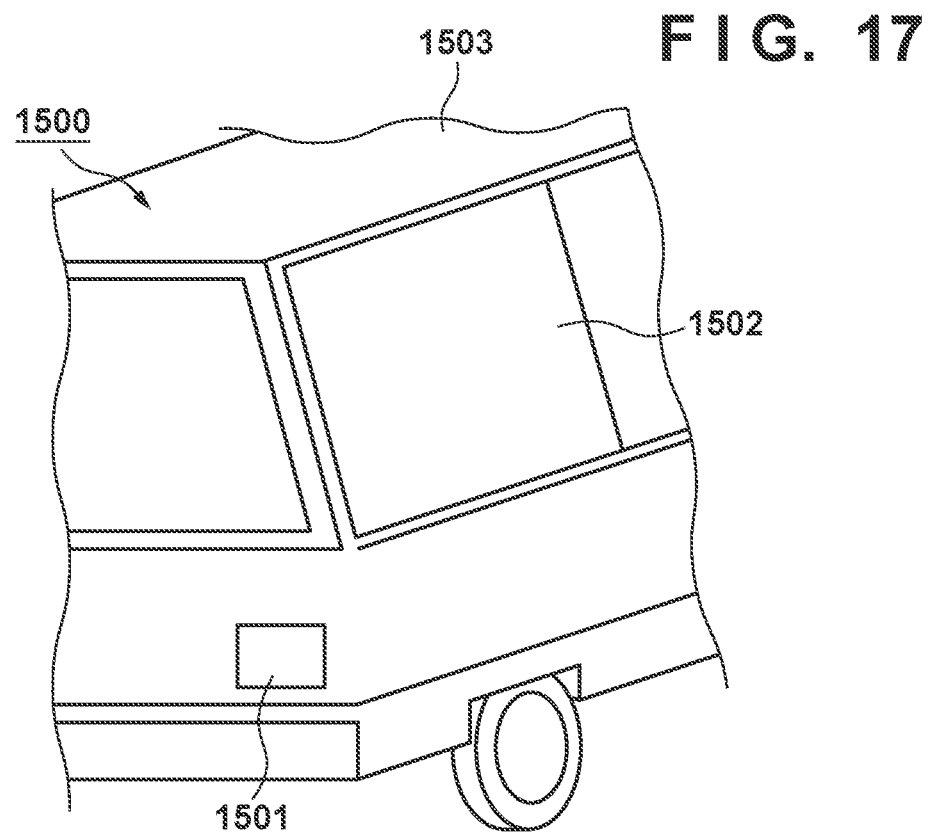
FIG. 17 is a view showing an example of a moving body using the light emitting device according to the embodiment.

FIG. 17 is a schematic view of an automobile having a taillight as an example of a vehicle lighting appliance using the light emitting device 100 or 100' of this embodiment. An automobile 1500 has a taillight 1501, and can have a form in which the taillight 1501 is turned on when performing a braking operation or the like. The light emitting device 100 or 100' of this embodiment can be used as a headlight serving as a vehicle lighting appliance. The automobile is an example of a moving body, and the moving body may be a ship, a drone, an aircraft, a railroad car, an industrial robot, or the like. The moving body may include a main body and a lighting appliance provided in the main body. The lighting appliance may be used to make a notification of the current position of the main body.

The light emitting device 100 or 100' according to this embodiment can be applied to the taillight 1501. The taillight 1501 can include a protection member for protecting the display region 201 of the light emitting device 100 or 100' functioning as the taillight 1501. The material of the protection member is not limited as long as the material is a transparent material with a strength that is high to some extent, and an example is polycarbonate. The protection member may be made of a material obtained by mixing a furandicarboxylic acid derivative, an acrylonitrile derivative, or the like in polycarbonate.

The automobile 1500 can include a vehicle body 1503, and a window 1502 attached to the vehicle body 1503. This window can be a window for checking the front and back of the automobile, and can also be a transparent display. For this transparent display, the light emitting device 100 or 100' according to this embodiment may be used. In this case, the constituent materials of the electrodes and the like of the light emitting device 100 or 100' are formed by transparent members.

Figure 18A:
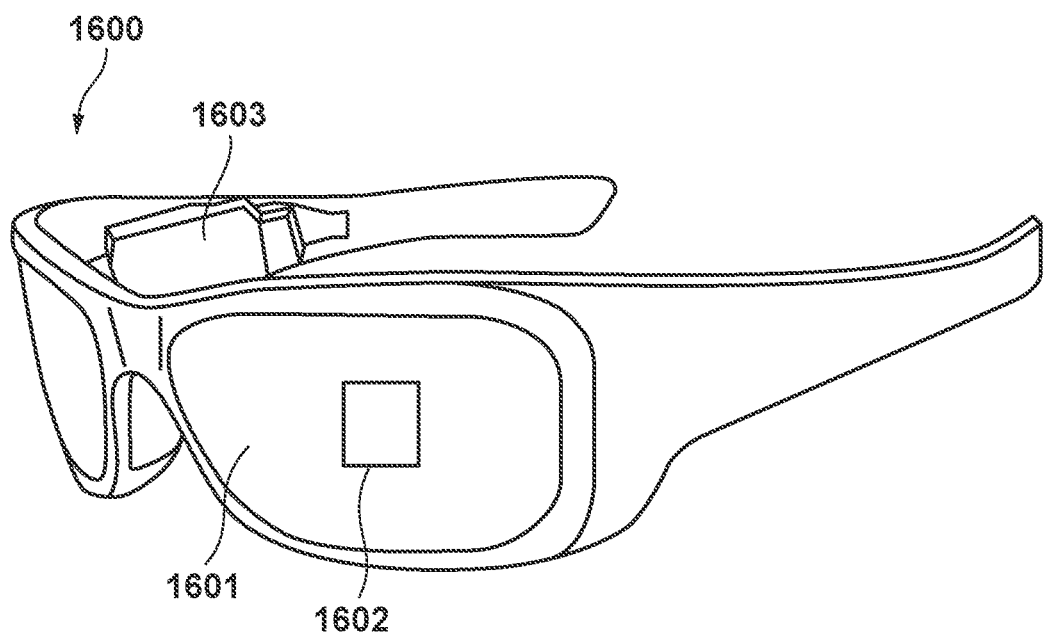
FIGS. 18A and 18B are views each showing an example of a wearable device using the light emitting device according to the embodiment.
Figure 18B:
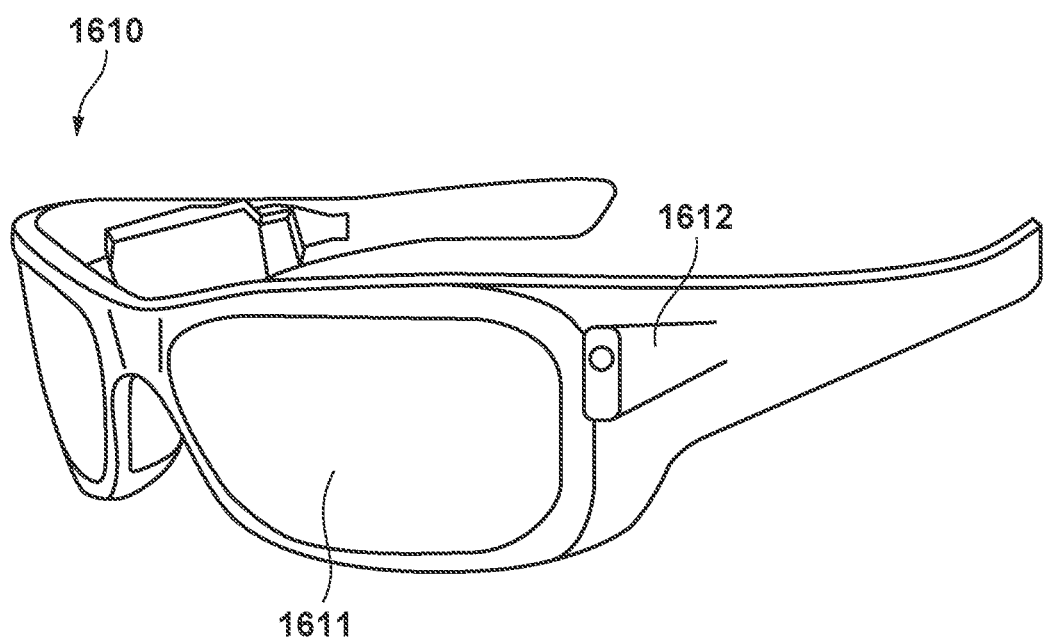

Further application examples of the light emitting device 100 or 100' according to this embodiment will be described with reference to FIGS. 18A and 18B. The light emitting device 100 or 100' can be applied to a system that can be worn as a wearable device such as smartglasses, a Head Mounted Display (HMD), or a smart contact lens. An image capturing display device used for such application examples includes an image capturing device capable of photoelectrically converting visible light and a light emitting device capable of emitting visible light.

Glasses 1600 (smartglasses) according to one application example will be described with reference to FIG. 18A. An image capturing device 1602 such as a CMOS sensor or an SPAD is provided on the front surface side of a lens 1601 of the glasses 1600. In addition, the light emitting device 100 or 100' according to this embodiment is provided on the back surface side of the lens 1601.

The glasses 1600 further include a control device 1603. The control device 1603 functions as a power supply that supplies electric power to the image capturing device 1602 and the light emitting device 100 or 100' according to each embodiment. In addition, the control device 1603 controls the operations of the image capturing device 1602 and the light emitting device 100 or 100'. An optical system configured to condense light to the image capturing device 1602 is formed on the lens 1601.

Glasses 1610 (smartglasses) according to one application example will be described with reference to FIG. 18B. The glasses 1610 include a control device 1612, and an image capturing device corresponding to the image capturing device 1602 and the light emitting device 100 or 100' are mounted on the control device 1612. The image capturing device in the control device 1612 and an optical system configured to project light emitted from the light emitting device 100 or 100' are formed in a lens 1611, and an image is projected to the lens 1611. The control device 1612 functions as a power supply that supplies electric power to the image capturing device and the light emitting device 100 or 100', and controls the operations of the image capturing device and the light emitting device 100 or 100'. The control device 1612 may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The light emitting device 100 or 100' according to the embodiment of the present invention can include an image capturing device including a light receiving element, and control a displayed image based on the line-of-sight information of the user from the image capturing device.

More specifically, the light emitting device 100 or 100' decides a first visual field region at which the user is gazing and a second visual field region other than the first visual field region based on the line-of-sight information. The first visual field region and the second visual field region may be decided by the control device of the light emitting device 100 or 100', or those decided by an external control device may be received. In the display region of the light emitting device 100 or 100', the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the light emitting device 100 or 100', or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the light emitting device 100 or 100', the image capturing device, or an external device. If the external device holds the AI program, it is transmitted to the light emitting device 100 or 100' via communication.

When performing display control based on line-of-sight detection, smartglasses further including an image capturing device configured to capture the outside can be applied. The smartglasses can display captured outside information in real time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-076750, filed May 6, 2022, which is hereby incorporated by reference herein in its entirety.

What is claimed is:

1. A light emitting device in which a plurality of pixels are arranged on a main surface of a substrate, wherein
each of the plurality of pixels comprises an organic layer including a light emitting layer, a reflective layer arranged between the main surface and the organic layer, a first insulating layer arranged between the reflective layer and the organic layer, a transmission electrode arranged between the first insulating layer and the organic layer, and a second insulating layer arranged so as to cover a peripheral edge portion of the transmission electrode while including an opening portion that exposes a part of the transmission electrode,
a groove extending through the first insulating layer is provided between the peripheral edge portion of the transmission electrode and the reflective layer,
the transmission electrode is electrically connected to the reflective layer in the groove, and
the second insulating layer includes a recess portion in a portion covering the groove.

2. The device according to claim 1, wherein
in an orthogonal projection with respect to the main surface, the groove includes a portion extending along an outer edge of the opening portion.

3. The device according to claim 1, wherein
in an orthogonal projection with respect to the main surface, the groove is arranged so as to continuously or intermittently surround the opening portion.

4. The device according to claim 1, wherein
the organic layer further includes a carrier injection layer having a higher conductivity than the light emitting layer, and
a film thickness of a portion of the carrier injection layer covering the recess portion is smaller than a film thickness of a portion of the carrier injection layer other than the portion covering the recess portion.

5. The device according to claim 4, wherein
the organic layer includes at least two light emitting layers including the light emitting layer, and at least one carrier injection layer including the carrier injection layer arranged between the at least two light emitting layers.

6. The device according to claim 1, wherein
the organic layer further includes a carrier injection layer having a higher conductivity than the light emitting layer, and a film thickness of a portion of the carrier injection layer covering the recess portion and extending in a direction crossing the main surface is smaller than a film thickness of a portion of the carrier injection layer extending in a direction parallel to the mains surface.

7. The device according to claim 1, wherein
each of the plurality of pixels further comprises a color filter, and
a thickness of a portion of the first insulating layer overlapping the opening portion in an orthogonal projection with respect to the main surface is based on an optical distance with which light of a wavelength band to be transmitted through the color filter is resonated.

8. The device according to claim 1, wherein
each of the plurality of pixels further includes a color filter,
the plurality of pixels include a first pixel and a second pixel corresponding to different colors transmitted through the color filters, and
a thickness of a portion of the first insulating layer arranged in the first pixel, the portion overlapping the opening portion in an orthogonal projection with respect to the main surface, is different from a thickness of a portion of the first insulating layer arranged in the second pixel, the portion overlapping the opening portion in the orthogonal projection with respect to the main surface.

9. The device according to claim 1, wherein
the transmission electrode covers an inner wall of the groove.

10. The device according to claim 1, wherein
the groove is filled with the second insulating layer.

11. The device according to claim 1, wherein
the first insulating layer and the second insulating layer are arranged between pixels adjacent to each other among the plurality of pixels.

12. A display device comprising the light emitting device according to claim 1, and an active element connected to the light emitting device.

13. A photoelectric conversion device comprising an optical unit including a plurality of lenses, an image sensor configured to receive light having passed through the optical unit, and a display unit configured to display an image,
wherein the display unit displays an image captured by the image sensor, and includes the light emitting device according to claim 1.

14. An electronic apparatus comprising a housing provided with a display unit, and a communication unit provided in the housing and configured to perform external communication,
wherein the display unit includes the light emitting device according to claim 1.

15. An illumination device comprising a light source, and at least one of a light diffusing unit and an optical film,
wherein the light source includes the light emitting device according to claim 1.

16. A moving body comprising a main body, and a lighting appliance provided in the main body,
wherein the lighting appliance includes the light emitting device according to claim 1.

17. A wearable device comprising a display apparatus configured to display an image,
wherein the display apparatus includes the light emitting device according to claim 1.

18. A manufacturing method of a light emitting device in which a plurality of pixels are arranged on a main surface of a substrate, the method comprising:
forming reflective layers so as to respectively correspond to the plurality of pixels;
forming a first insulating layer so as to cover the reflective layers;
forming, in the first insulating layer, grooves each of which extends through the first insulating layer and exposes the reflective layer;
forming, after the grooves are formed, transmission electrodes respectively corresponding to the plurality of pixels; and
forming a second insulating layer arranged so as to cover peripheral edge portions of the transmission electrodes while including opening portions each of which exposes a part of the transmission electrode,
wherein
the groove is arranged between the peripheral edge portion of the transmission electrode and the reflective layer,
the transmission electrode is electrically connected to the reflective layer in the groove, and
the second insulating layer includes a recess portion in a portion covering the groove.

* * * * *